(12) United States Patent
Peck et al.

(10) Patent No.: US 7,293,986 B2
(45) Date of Patent: Nov. 13, 2007

(54) VESTIBULE ASSEMBLY FOR A HEAT TREATMENT FURNACE

(75) Inventors: Kevin B. Peck, Sonora, CA (US); Mike D. Soliday, Sonora, CA (US); Jim Sanches, Sonora, CA (US)

(73) Assignee: MRL Industries, Inc., Sonora, CA (US)

( * ) Notice: Subject to any disclaimer, the term of this patent is extended or adjusted under 35 U.S.C. 154(b) by 1003 days.

(21) Appl. No.: 10/429,834

(22) Filed: May 6, 2003

(65) Prior Publication Data

US 2004/0234920 A1 Nov. 25, 2004

(51) Int. Cl.
*F27D 15/02* (2006.01)

(52) U.S. Cl. .................. 432/81; 432/4; 432/77

(58) Field of Classification Search ............ 432/4, 432/77, 81, 83, 253, 239, 241, 247
See application file for complete search history.

(56) References Cited

U.S. PATENT DOCUMENTS

| 4,883,424 | A | 11/1989 | Sakai et al. |
|---|---|---|---|
| 5,097,890 | A | 3/1992 | Nakao |
| 5,178,534 | A | 1/1993 | Bayne et al. |
| 5,827,057 | A | 10/1998 | Cress |
| 5,904,478 | A | 5/1999 | Weaver et al. |
| 6,419,481 | B2 * | 7/2002 | Ahvenainen ............ 432/116 |
| 6,769,908 | B2 | 8/2004 | Kawase |
| 6,803,546 | B1 | 10/2004 | Boas et al. |
| 2002/0110770 | A1 * | 8/2002 | Chu et al. ............... 432/77 |

\* cited by examiner

*Primary Examiner*—Gregory Wilson
(74) *Attorney, Agent, or Firm*—Drinker Biddle & Reath LLP

(57) ABSTRACT

The present invention provides a heat treating process chamber having a housing with a flow passage in communication with a vestibule assembly. The vestibule assembly includes an outer ring with a first groove and an inner ring with a second groove. The first groove is formed in an axially inwardly facing surface of the outer ring. The first groove has a portion open in a radially outer direction and an axially inner direction. The second groove opens in an axially inner direction and is formed in an axially outwardly facing surface of the inner ring. The first and second grooves form a passageway when they are in an axially superimposed relationship. The first groove forms a radially outwardly open end and the second groove forms an axially inwardly facing end of the passageway. The passageway communicates with the flow passage thereby allowing passage of a temperature adjusting medium.

52 Claims, 16 Drawing Sheets

VESTIBULE ASSEMBLY FOR A HEAT TREATMENT FURNACE

BACKGROUND OF THE INVENTION

1. Field of the Invention

The present invention relates generally to forced-air cooling process chambers. More specifically, the present invention relates to vestibule assemblies for forced-air cooling process chambers.

2. Description of Related Art

Today, many products are subjected to heat treating operations during production. The product undergoes heat treatment for many reasons, including thermal curing during semiconductor wafer fabrication, annealing operations to harden a material of the product, such as steel, or the like. The products usually reside within a furnace as the products are subjected to heat treatment. Thus, the temperature of the furnace controls heat treatment of the products.

Typically, products within the furnace are brought to a certain temperature for heat treatment. An example of heat treatment includes bringing a product to a given temperature in order to begin an oxidation process on the surface of the material. Further examples include elevating the temperature of a material in order to bring about annealing of the material. Nonetheless, in both the oxidation and the annealing examples, often times, a user requires that the material only undergo the operation for a specific period of time. The necessity of heat treating the material for a specific period of time requires that the temperature of the material remain constant in order to avoid further reaction of the material.

Often times users desire temperature adjustability of a furnace in order to increase productivity of the furnace. To further illustrate, upon completion of a heat treatment operation, a user must wait for sufficient cooling of the furnace prior to removing the products from the furnace. As may be appreciated, the down time associated with the cooling period decreases productivity of the furnace.

Prior art attempts to increase heat exchange rates within a furnace include the vestibule assemblies shown with reference to FIGS. 1A and 1B. The vestibule assemblies are typically disposed at opposite ends of the furnace. FIG. 1A illustrates a vestibule end assembly 100 which allows temperature modulation of a furnace (not shown) in accordance with the prior art. The vestibule end assembly 100, which has a radial configuration, includes a component 102 coupled with a component 104. A portion of the component 102 has a thickness $Z_{1A}$ as shown. The component 104 includes passageways 106 through which cooling air passes thereby allowing cooling air to be conducted/passed through a vestibule which have a dimension of $Z_2$. The thickness $Z_{1A}$ and the dimension $Z_2$ are constraining factors which dictate the size of a process chamber which may be used in various application. During heat treatment operations by a furnace using the vestibule end assembly 100, cooling air passes through the passageways 106, thereby introducing cooling air into the process chamber.

The physical parameters of the vestibule end assembly 100 make the vestibule end assembly 100 an unattractive option to furnace manufacturers. More specifically, the thickness $Z_{1A}$ and $Z_{1B}$ of the walls 102a and 102b must generally be 0.50 inches such that the component 102 and the walls 102a and 102b maintain structural rigidity of the vestibule end assembly 100. In addition, the air passage dimension must be approximately 0.50 or more to effectively conduct the cooling airflow. As those skilled in the art will recognize, the required thickness of the walls 102a and 102b restricts the size of the process tube that can be used in a given furnace assembly.

The vestibule end assembly 100 was also constructed of a fragile material such as ceramic. During manufacturing and handling of the vestibule end assembly 100, the components 102 and 104 were prone to breakage, again increasing overall costs associated with the use of the vestibule end assembly 100. Moreover, thermal cycling within the vestibule caused fiber shrinkage and adhesive failure. Thus, airflow through the passageways 106 dislodged individual fibers of the ceramic, thereby contaminating the fluid flowing through vestibule. Additionally, the fiber shrinkage leads to air leakage at a joint between components 102 and 104, cracking and breakage of components 102 and 104.

In addition to the vestibule end assembly 100 shown with reference to FIG. 1A, prior art attempts to provide cooling to a furnace also included the vestibule end assembly 108, shown with respect to FIG. 1B. The vestibule end assembly 108 includes passageways 110a and 110b, as may be seen with regards to the Figure. The passageways 110a and 110b also include liners 112 and 114 in order to minimize particulate generation in the fluid stream cooling. In order to form the vestibule assembly 108, a component 108a of the vestibule assembly 108 is formed from a single unit. The passageways 110a and 110b are then bored into the component 108a. The passageways 110a and 110b are bored at differing angles into the configuration as shown with reference to the Figure. Upon formation of the passageways 110a and 110b, the liners 112 and 114 are placed in the passageways 110a and 110b, respectively. The cost associated with the formation of the vestibule assembly 108 makes it an unattractive option to manufacturers of furnaces. In addition, the liners 112 and 114 are typically formed from a hard ceramic having properties different from that of the vestibule assembly 108. These properties include a greater rate of thermal expansion and contraction during thermal cycling of a furnace using the vestibule assembly 108. Thus, the liners 112 and 114 may become dislodged from within the passageways 110a and 110b, thereby potentially contaminating a furnace using the vestibule assembly 108 with particles. Likewise, dislodgement of the liners 112 and 114 may reduce the airflow through the passages. Furthermore, if the liners 112 and 114 become dislodged, the liners 112 and 114 may fall out of the assembly during vertical mounting of the assembly thereby introducing the possibility of damaging other components inside the process chamber.

Therefore a need exists for an apparatus which cools a furnace during heat treatment operations. This apparatus should be constructed of a material which minimizes the possibility of contamination of a vestibule and a furnace during heat treatment operations.

BRIEF SUMMARY OF THE INVENTION

The present invention fills the aforementioned needs by providing a vestibule assembly having a robust construction using minimal components. Moreover, a vestibule assembly made in accordance with the present invention minimizes particulate contamination during heat treatment operations.

In one embodiment of the present invention, a forced air cooling process chamber for heat treating a product is disclosed. The forced air cooling process chamber comprises a housing, a flow passage disposed about a periphery of the housing and a vestibule assembly at a first end of the housing along with a second vestibule assembly at a second end of the housing opposite the housing first end. The flow passage allows for the flow of a temperature adjusting medium about the periphery of the housing during heat treating operations with the forced air cooling process chamber. The vestibule assembly fluidly communicates with the flow passage and includes an axially outer ring and an axially inner ring. The axially outer ring of the vestibule assembly has a first groove formed in an axially inwardly facing surface of the axially outer ring. A portion of the first groove is open in both a radially outer direction and an axially inner direction. The axially inner ring has a second groove formed in the axially outwardly facing surface of the axially inner ring. The second groove opens in an axially inner direction relative to the axially inner ring. Upon fitment of the axially inner ring with the axially outer ring, the first groove and the second groove form a passageway in fluid communication with the flow passage. The passageway has a radially outwardly open end formed by the first groove and an axially inwardly facing end formed by the second groove. The fluid communication between the passageway and the flow passage allows the passage of a temperature adjusting medium from the vestibule assembly and into the flow passage. The second vestibule assembly is located at a second end opposite the first end and also includes an axially outer ring and an axially inner ring. As such, temperature adjusting medium traveling from the first vestibule assembly and into the flow passage exits the forced air cooling process chamber via the second vestibule assembly disposed at the second end of the housing. The cooling fluid flow may be periodically reversed in order to enhance the uniformity of cooling in the assembly.

In another embodiment of the present invention, a forced air cooling process chamber for heat treating a product is disclosed. In this embodiment, the forced air cooling process chamber includes a housing having a first end, a flow passage disposed about a periphery of the housing and a vestibule assembly coupled with the flow passage. The flow passage allows for the passage of a temperature adjusting medium about the forced air cooling process chamber during heat treatment of a product within the forced air cooling process chamber. The vestibule assembly is disposed at the first end of the housing and includes a first ring and second ring. The first ring of the vestibule assembly has a groove axially and radially disposed with respect to the first ring. A portion of the first ring is partially blocked in both an axial direction and a radial direction relative to the first ring. Moreover, the first ring is in fluid communication with the flow passage. The second ring also includes a groove which is axially and radially disposed with respect to the second ring. At least a portion of the second ring groove is partially blocked in both an axial and a radial direction relative to the second ring. In addition, the second ring groove fluidly communicates with the flow passage. The first ring and the second ring interface with one another such that the first ring groove and the second ring groove align with one another to form a passageway. The passageway allows for the flow of the temperature adjusting medium from the flow passage such that the flow passage and the vestibule assembly provide low particulate contamination within a forced air cooling process chamber.

In yet another embodiment of the present invention, a forced air cooling process chamber is disclosed. In this embodiment, the forced air cooling process chamber includes a housing having a first end and a second end, a flow passage disposed about a periphery of the housing, a first vestibule assembly disposed at the housing first end and a second vestibule assembly disposed at the housing second end. The flow passage extends from the housing first end to the housing second end and allows for the passage of a temperature adjusting medium between the first and second ends of the housing. The first vestibule assembly includes an axially outer ring and an axially inner ring. The axially outer ring includes a first groove which is formed in an axially inwardly facing surface of the axially outer ring. The first groove also includes a portion which is open in both a radially outer direction and an axially inner direction. The axially inner ring of the first vestibule assembly includes a second groove which is formed in an axially outwardly facing surface of the axially inner ring. The second groove of the axially inner ring opens in the axially inner direction such that when the axially outer ring and the axially inner ring are interfaced with one another in an axially superimposed relationship, the first groove and the second groove form a passageway. The passageway includes a radially outwardly open end formed by the first groove and an axially inwardly facing end formed by the second groove. The passageway is in fluid communication with the flow passage such that a temperature adjusting medium may flow through the first vestibule assembly and into the flow passage. The second vestibule assembly is also in fluid communication with the flow passage such that the temperature adjusting means travels between the first and second vestibule assemblies.

As may be appreciated, the present invention provides a vestibule assembly for a processing chamber which minimizes particulate contamination and increases uniform flow of a temperature adjusting medium throughout the processing chamber.

BRIEF DESCRIPTION OF THE SEVERAL VIEWS OF THE DRAWINGS

Many advantages of the present invention will be apparent to those skilled in the art with a reading of this specification in conjunction with the attached drawings, wherein like reference numerals are applied to like elements and wherein.

DETAILED DESCRIPTION OF THE INVENTION

In accordance with an embodiment of the present invention, a forced air cooling process chamber is provided having vestibule assemblies disposed at opposing ends of the forced air cooling process chamber. The vestibule assemblies include individual sections which are machined and assembled as a laminate thereby forming the vestibule assemblies. Grooves formed within the individual sections form passageways within the vestibule assembly upon assembly of the individual sections as a laminate. Moreover, as will be discussed in greater detail with respect to the accompanying Figures, the passageways formed within the vestibule assemblies are coated with a surface treatment which coats and seals the vestibule assembly thereby reducing particulate generation in an airflow stream through the vestibule assembly.

Figure 1A:
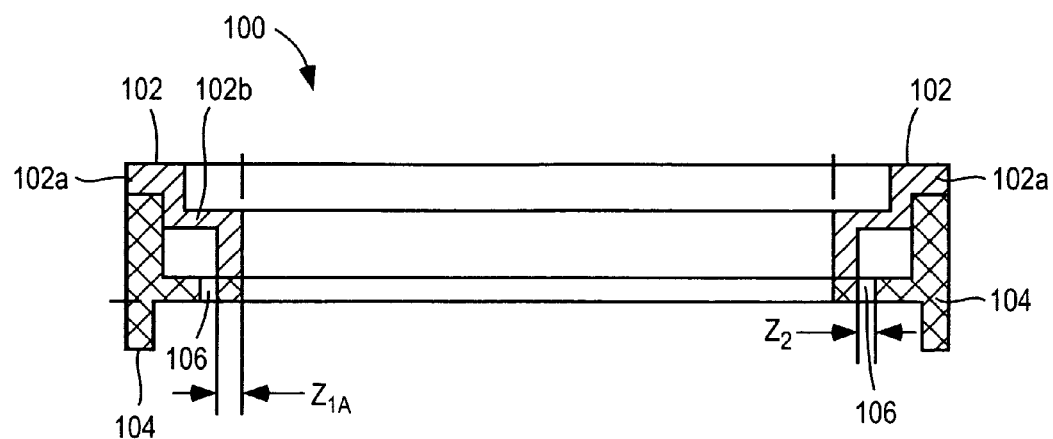
FIG. 1A illustrates a vestibule end assembly which allows temperature modulation of a furnace in accordance with the prior art.
Figure 1B:
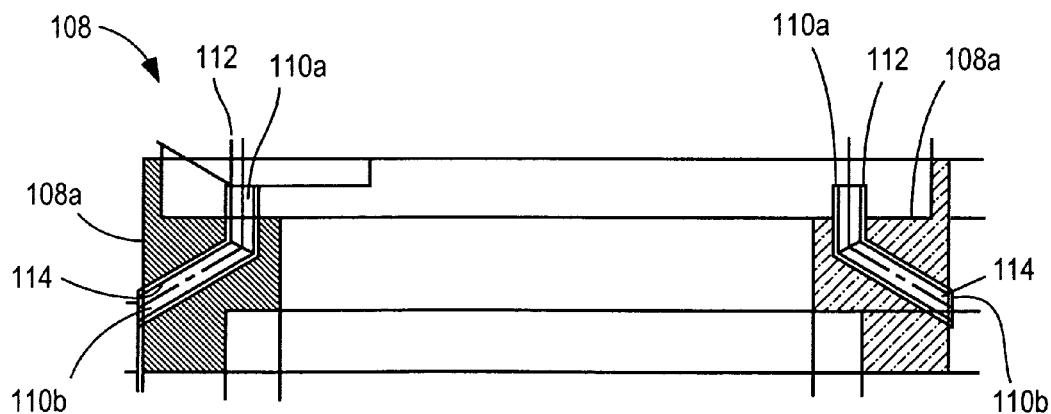
FIG. 1B illustrates a vestibule end assembly in accordance with the prior art.
Figure 2:
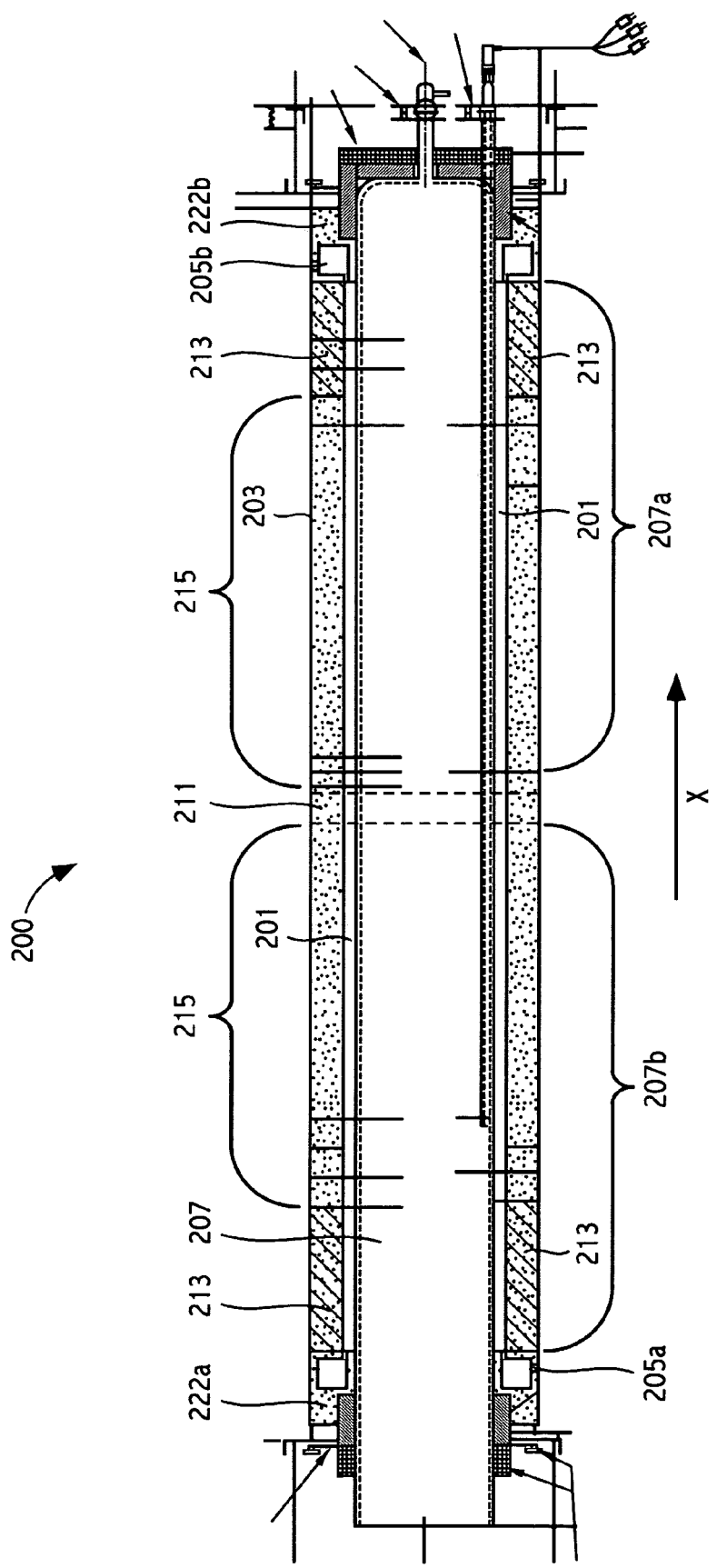
FIG. 2 illustrates a schematic view of a forced-air cooling process chamber having vestibule assemblies in accordance with an embodiment of the present invention.

Now making reference to the Figures, and more particularly FIG. 2, FIG. 2 illustrates a schematic view of a forced-air cooling process chamber 200 having vestibule assemblies 222a and 222b in accordance with an embodiment of the present invention. The forced-air cooling process chamber 200 heat treats products, such as semiconductor wafers, disposed within a process chamber 207 of the forced-air cooling process chamber 200. The forced-air cooling process chamber 200 includes a flow passage 201 disposed about a periphery of the process chamber 207, a housing 203 which encloses both the flow passage 201 and the process chamber 207, vestibule assemblies 222a and 222b and ducts 205a and 205b. The vestibule assemblies 222a and 222b are disposed at a first end and a second end of the housing 203 and fluidly communicate with the ducts 205a and 205b. In addition, the vestibule assemblies 222a and 222b are in fluid communication with the flow passage 201.

During operation of the forced-air cooling process chamber 200, a temperature adjusting medium (not shown), such as air, enters the forced-air cooling process chamber 200 via either the duct 205a or 205b. In the embodiment shown with respect to FIG. 2, the temperature adjusting medium enters the duct 205a. After entry, the temperature adjusting medium travels into the flow passage 201 via the vestibule assembly 222a. In this embodiment, the temperature adjusting medium travels through the flow passage 201 as indicated by the directional arrow X wherein the temperature adjusting medium travels from the vestibule assembly 222a through the flow passage 201 and to the vestibule assembly 222b. The cooling medium may also be periodically reversed to enhance uniformity of cooling.

As the temperature adjusting medium travels through the flow passage 201, the temperature adjusting medium adjusts a temperature of the process chamber 207 during heat treatment operations by the forced-air cooling process chamber 200. Once the temperature adjusting medium travels into the vestibule assembly 222b, the temperature adjusting medium exits the forced-air cooling process chamber 200 through the duct 205b. It should be noted that the temperature adjusting medium may travel through the flow passage 201 in the opposite direction (opposite the direction indicated by directional arrow X) such that the temperature adjusting medium enters the forced-air cooling process chamber 200 via the duct 205b and exits the forced-air cooling process chamber 200 through the duct 205a. When the temperature adjusting medium travels through the vestibule assemblies 222a and 222b, the temperature adjusting medium travels through an axially inner ring 220 and an axially outer ring 218, as will be discussed with reference to FIGS. 3 through 5.

The forced-air cooling process chamber 200 also includes process zones 215 adjacent the buffer zones 213. During treatment of products within the forced-air cooling process chamber 200, such as semiconductor wafers, actual processing, such as temperature treatments, occurs within the process zones 215.

In accordance with one embodiment of the present invention, the forced-air cooling process chamber 200 also includes a third vestibule assembly 211. In an embodiment where the forced-air cooling process chamber 200 includes the third vestibule assembly 211, the forced-air cooling process chamber includes heating zones 207a and 207b. The heating zones 207a and 207b may have different temperatures such that products passing through the forced-air cooling process chamber 200 are subjected to differing thermal processes as the product passes through the forced-air cooling process chamber 200. It should be noted that the third vestibule assembly 211 includes the axially outer ring 218 and a first groove 224 as will be discussed with reference to FIGS. 3 through 5 and the vestibule assembly 222a. Likewise, the third vestibule assembly 211 also includes the axially inner ring 220 and a second groove 230 as will be discussed with regards to FIG. 3 and the vestibule assembly 222a.

Figure 3:
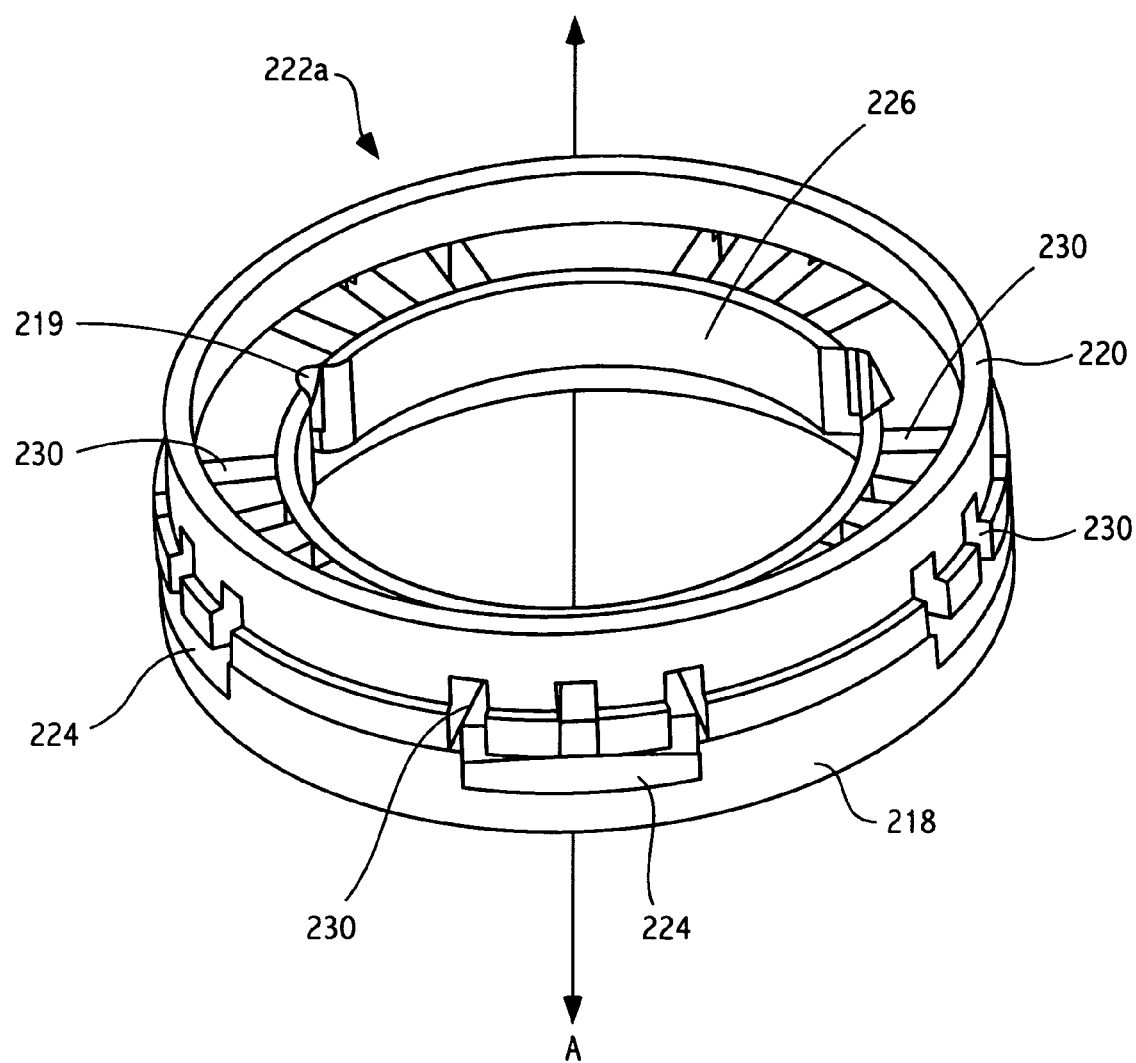
FIG. 3 illustrates a vestibule assembly for the forced-air cooling process chamber of FIG. 2 in accordance with an alternative embodiment of the present invention.

Now making reference to FIG. 3, FIG. 3 illustrates the vestibule assembly 222a for the forced-air cooling process chamber 200 of FIG. 2 in accordance with an embodiment of the present invention. In an embodiment where the forced-air cooling process chamber 200 includes the vestibule assembly 222a disposed at a first end the forced-air cooling process chamber 200, the forced-air cooling process chamber 200 also has the second vestibule assembly 222b disposed at an end of the forced-air cooling process chamber 200 opposite the first end of the forced-air cooling process chamber 200 and the vestibule assembly 222a. The vestibule assembly 222a includes the axially outer ring 218 which interfaces with the axially inner ring 220. As may be seen with reference to the Figure, the axially outer ring 218 interfaces with the axially inner ring 220 via superimposition.

Figure 4A:
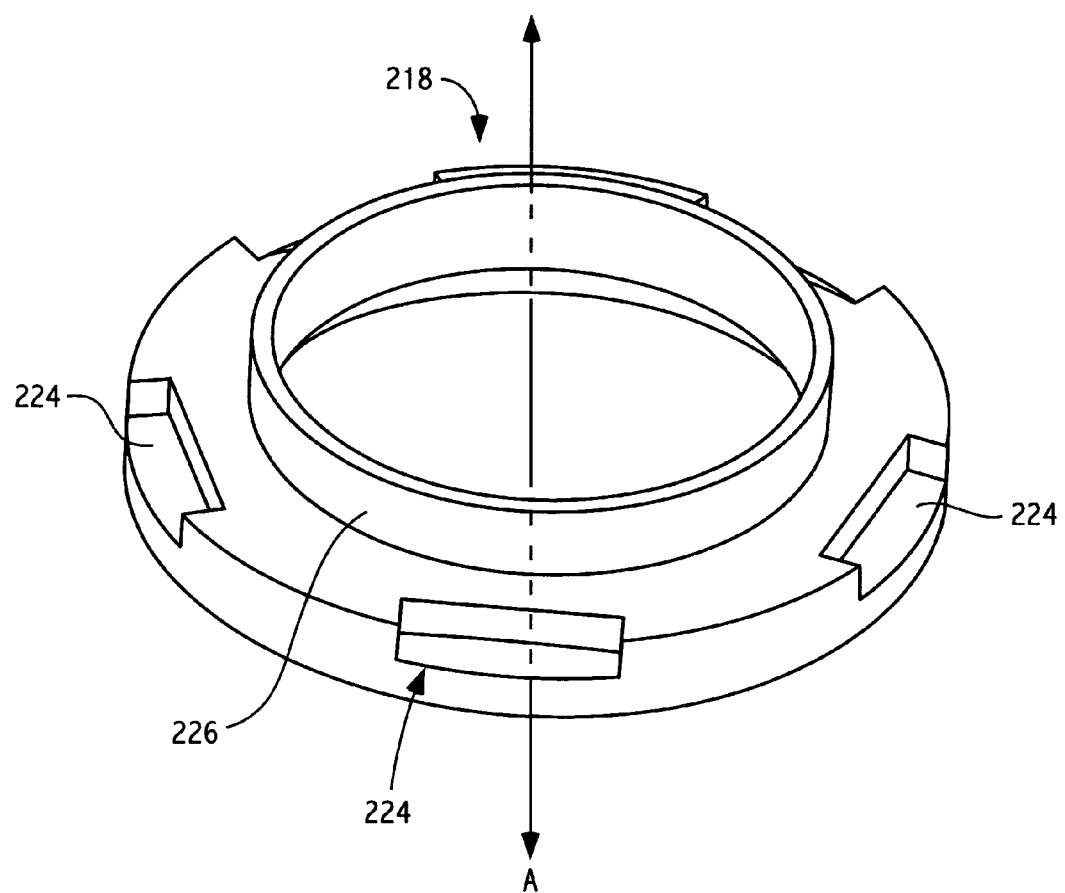
FIG. 4A shows a perspective view of an axially outer ring of the vestibule assembly shown with respect to FIG. 3 in accordance with an alternative embodiment of the present invention.
Figure 4B:
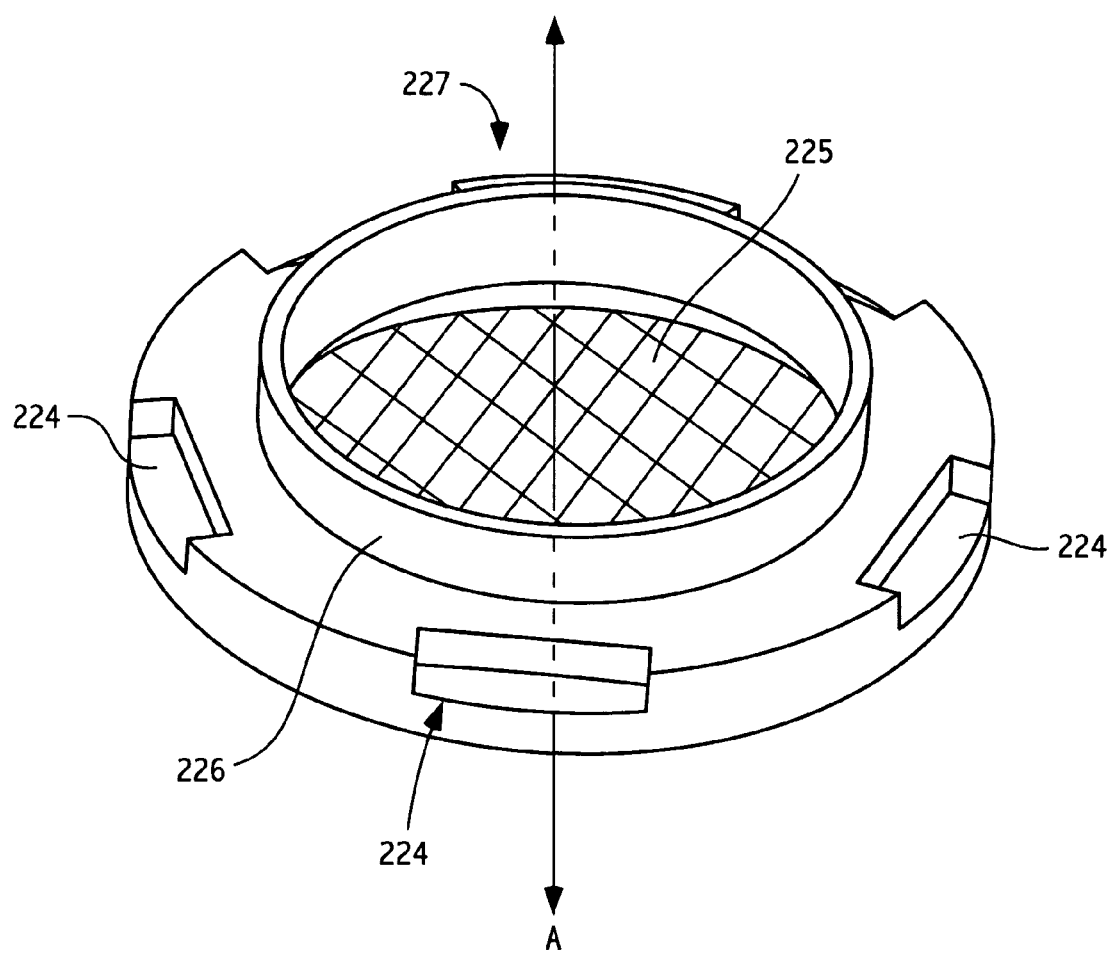
FIG. 4B is a perspective view of an axially outer ring of the vestibule assembly shown with respect to FIG. 3 having an endcap, in accordance with an embodiment of the present invention.

Now making reference to FIG. 4A, FIG. 4A shows a perspective view of the axially outer ring 218 shown with respect to FIG. 3 in accordance with an embodiment of the present invention. It should be noted that both the vestibule assemblies 222a and 222b include the axially outer ring 218. The axially outer ring 218 has a circular configuration and includes the first groove 224 disposed about a periphery of the axially outer ring 218 and an axial support 226. The axially outer ring 218 may include any number of first grooves 224. The first groove 224 is machined into the axially outer ring 218 prior to integration of the axially outer ring 218 with the axially inner ring 220. In this embodiment of the present invention, the axially outer ring 218 may be fabricated from a vacuum formed ceramic fiber, such as a formed bulk ceramic fiber having a blend of alumina, zircona, silica, or the like. The first groove 224 is machined into the axially outer ring 218 during formation of the axially outer ring 218. Moreover, the first groove 224 is also finished with a surface treatment which coats and seals the ceramic fiber of the axially outer ring 218 after machining. An example of a surface treatment which may be used includes Alumina/Zirconia or the like. As such, particulate generation from the axially outer ring 218 during flow of a temperature adjusting medium is minimized. It should be noted that the axially outer ring 218 may include a plurality of first grooves such as the first groove 224 disposed about the periphery of the axially outer ring 218. The first groove 224 is formed in an axially inwardly facing surface of the axially outer ring 218 relative to an axial axis A of the axially outer ring 218. A portion of the first groove 224 is open in a radially outer direction of the axially outer ring 218. Morever, the first groove 224 is partially open in an axially inner direction relative to the axial axis A of the axially outer ring 218. The axially outer ring 218 includes a passageway 219 through which products within the process chamber 207 may pass during heat treatment operations of the forced-air cooling process chamber 200. The axial support 226 extends from an axial inner surface of the axially outer ring 218 along an axial axis A of the axially outer ring 218. The axial support 226 provides support between the axially outer ring 218 and the axially inner ring 220 during interface.

Figure 5:
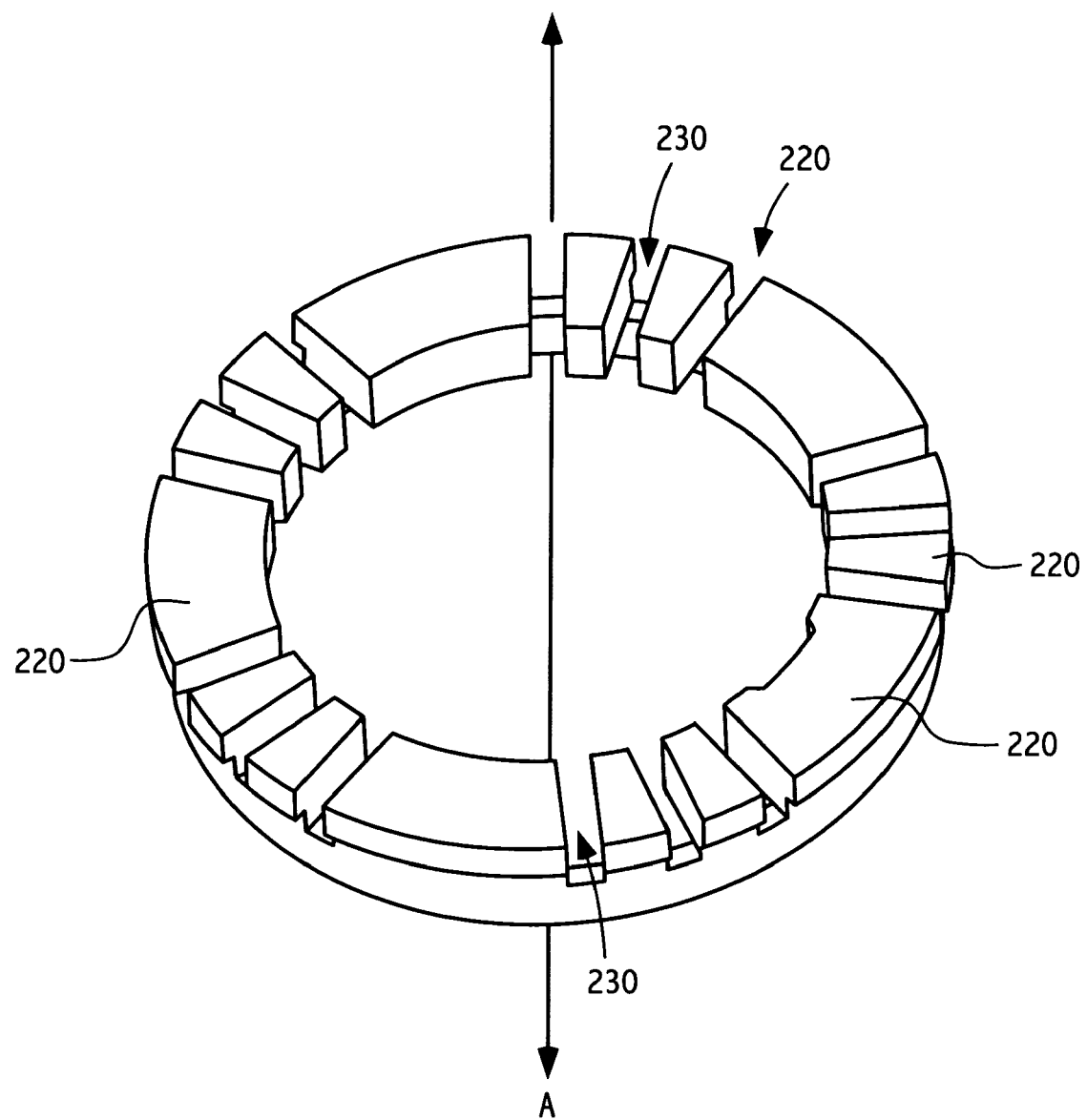
FIG. 5 is a perspective view of an axially inner ring of the vestibule assembly shown with reference to FIG. 3 in accordance with an alternative embodiment of the present invention.

Now making reference to FIG. 5, FIG. 5 is a perspective view of the axially inner ring 220 shown with reference to FIG. 3 in accordance with an embodiment of the present invention. It should be noted that both the vestibule assemblies 222a and 222b include the axially inner ring 220. The axially inner ring 220 of the vestibule assembly 222a includes the second groove 230 disposed about a periphery of the axially inner ring 220. As discussed with reference to the first groove 224, the second groove 230 is machined into the axially inner ring 220 during formation of the axially inner ring 220. Moreover, the second groove 230 is treated with a surface treatment such as that used with the first groove 224 which minimizes particulate generation during thermal operations of the forced-air cooling process chamber 200. The second groove 230 is disposed about a periphery of the axially inner ring 220. In addition, as may be seen with reference to the Figure, the second groove 230 is formed in an axially outwardly facing surface of the axially inner ring 220 relative an axis A of the axially inner ring 220. The second groove 230 is open in an axially inner direction of axially inner ring 220 relative to the axis A.

Returning attention to FIG. 3 and the vestibule assembly 222a, during formation of the vestibule assembly 222a, the axially inner ring 220 is formed with the axially outer ring 218 as shown. More specifically, the axially inner ring 220 and the axially outer ring 218 are axially superimposed with respect to each other. Upon formation of the vestibule assembly 222a with the axially outer ring 218 and the axially inner ring 220, the first groove 224 of the axially outer ring 218 and the second groove 230 of the axially inner ring 220 form a passageway for the vestibule assembly 222a. It should be noted in an embodiment where the rings 218 and 220 include a plurality of grooves, a plurality of passageways are formed in the vestibule assemblies 222a and 222b. The passageway of the vestibule assembly 222a has a radially outwardly open end formed by the first groove 224 and an axially inwardly facing end formed by the second groove 230 relative to an axis A of the vestibule assembly 222a. The radially outwardly open end is formed by the first groove 224. Likewise, the axially inwardly facing end is formed by the second groove 230. The passageway of the vestibule assembly 222a is in fluid communication with the flow passage 201 shown with reference to FIG. 2. Therefore, a temperature adjusting medium enters the forced-air cooling process chamber 200 and exits the forced-air cooling process chamber 200 through the passageways of the vestibule assemblies 222a and 222b. In the embodiment shown with reference to FIG. 3, the vestibule assembly 222a is shown having a passageway formed by the first and second grooves 224 and 230. As mentioned earlier, the vestibule assembly 222b also includes the axially inner ring 220 having the first groove 224 and the axially outer ring 218 having the second groove 230. Thus, the vestibule assembly 222b also includes the previously described passageways upon formation of the axially outer ring 220 with the axially inner ring 218. As such, during operation of the forced-air cooling process chamber 200, a temperature adjusting medium entering the duct 205 and into the vestibule assembly 222a passes through the passageway formed by the first groove 224 and the second groove 230 and into the flow passage 201 and exits through the vestibule assembly 222b.

Making reference once again to FIG. 2, the vestibule assemblies 222a and 222b are formed at a first end and a second end of the housing 203. In accordance with an embodiment of the present invention, the orientation of the vestibule assemblies 222a and 222b within the forced-air cooling process chamber 200 is such that the vestibule assemblies 222a and 222b are offset from one another. The offset between the vestibule assemblies 222a and 222b is such that a radial distance between the grooves 224 and 230 of the vestibule assembly 220a and the grooves 224 and 230 of the vestibule assembly 222b is maximized. In accordance with an embodiment of the present invention, the offset may be in a range preferably between about half the angular distance between the injection points in order to maximize the distance from the fluid flow injection and fluid flow extraction. As may be appreciated, the offset between the vestibule assemblies within the forced-air cooling process chamber 200 allows uniform temperature adjustment along the process chamber 207. Likewise, the offset between the vestibule assemblies enhances uniformity of temperature adjustment by creating a spiral fluid flow path. It should be noted that the offset may be angled to further enhance or otherwise redirect the spiral fluid flow path effect.

Figure 4C:
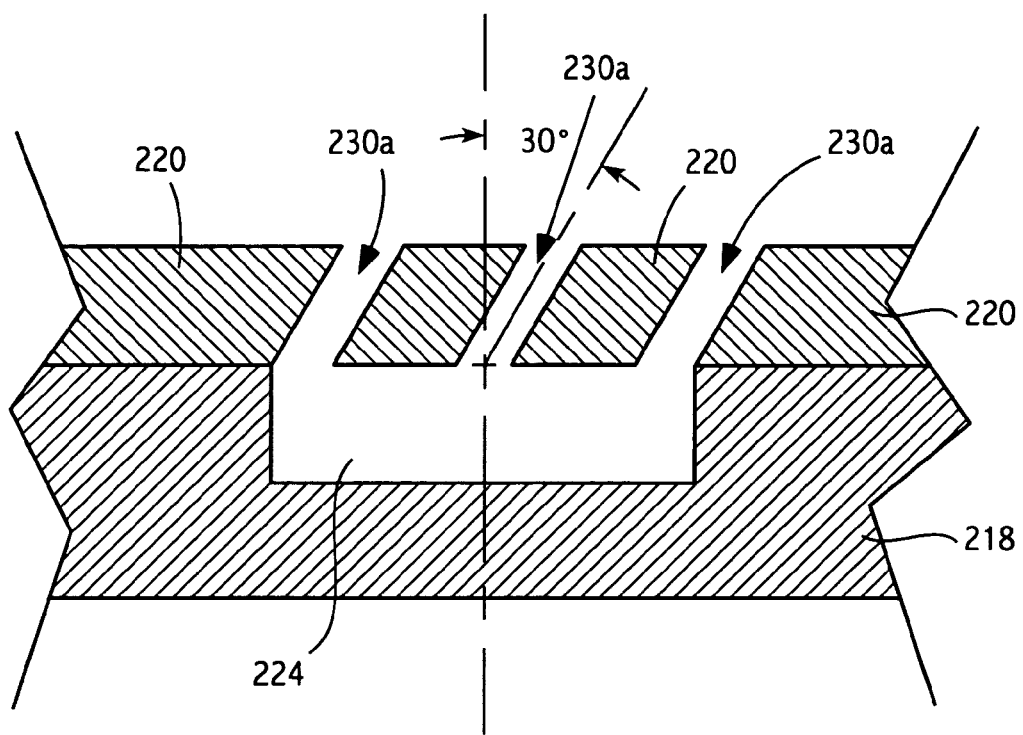
FIG. 4C is an embodiment of the present invention illustrating a section through an angled first groove and an angled second groove on the axially outer ring shown with reference to FIG. 3 in accordance with an embodiment of the present invention.

In accordance with another embodiment of the present invention, the passageways formed by the grooves may be angled in the vestibule assemblies, as shown with reference to FIG. 4C. Now making reference to FIG. 4C, FIG. 4C illustrates a section of the vestibule assembly 222a having the first groove 224 in the axially outer ring 218 and angled second grooves 230a in the axially inner ring 220. The first groove 224 and the angled second grooves 230a communicate with one another to form angled passageways, as shown with reference to the Figure. It should be noted that in an embodiment where the vestibule assemblies 222a and 222b include angled passageways as shown with respect to FIG. 4C, the first and second angled grooves 224 and 230a are disposed about a radial periphery of the axially outer and inner rings 218 and 220, as discussed with reference to the first and second grooves 224 and 230 earlier. In an embodiment where the vestibule assembly 222a includes angled passageways, the vestibule assembly 222b also includes the same angled passageways such that uniform temperature adjustment will occur along the heating sections 207a and 207b, as discussed earlier. Moreover, the angled passageways may be formed at any angle relative to the axially outer ring 218, such as 30 degrees, as shown.

The second vestibule assembly also includes the previously mentioned axially outer ring 218 and the axially inner ring 220 along with the first and second grooves 224 and 230. In an embodiment where the forced-air cooling process chamber 200 includes a third vestibule assembly 211 (FIG. 2), the third vestibule assembly has the axially outer ring 218 and the first groove 224 discussed with reference to FIG. 4A and the vestibule assembly 222a. Likewise, the third vestibule assembly 211 includes the axially inner ring 220 and the second groove 230 mentioned with respect to FIG. 5 and the vestibule assembly 222a.

It should be noted that the vestibule assemblies 222a and 222b having the axially outer ring 218 may be used in a variety of processing furnaces, including a batch furnace. In an embodiment where the vestibule assemblies 222a and 222b are used with a batch furnace, either the vestibule assembly 222a or the vestibule assembly 222b include an axially outer ring 227 as shown with reference to FIG. 4B. As may be seen with respect to the Figure, the axially outer ring 227 includes the first groove 224 described in FIG. 4A. Also, the axially outer ring 227 does not include the passageway 219, thereby allowing fitment of either of the vestibule assemblies 222a and 222b as an end cap. Instead, the axially outer ring 227 includes an end cap 225. Moreover, in an embodiment where the vestibule assemblies 222a and 222b are used with a batch furnace, the axially outer ring 227 may have an active heating element or a passive insulator. Examples of an active heating element which may be used include a resistive wire, a top heater for a vertical batch furnace or the like. In an embodiment where the axially outer ring 225 has a passive insulator, an example of a passive insulator that may be used includes a vacuum formed ceramic fiber plug.

Figure 6A:
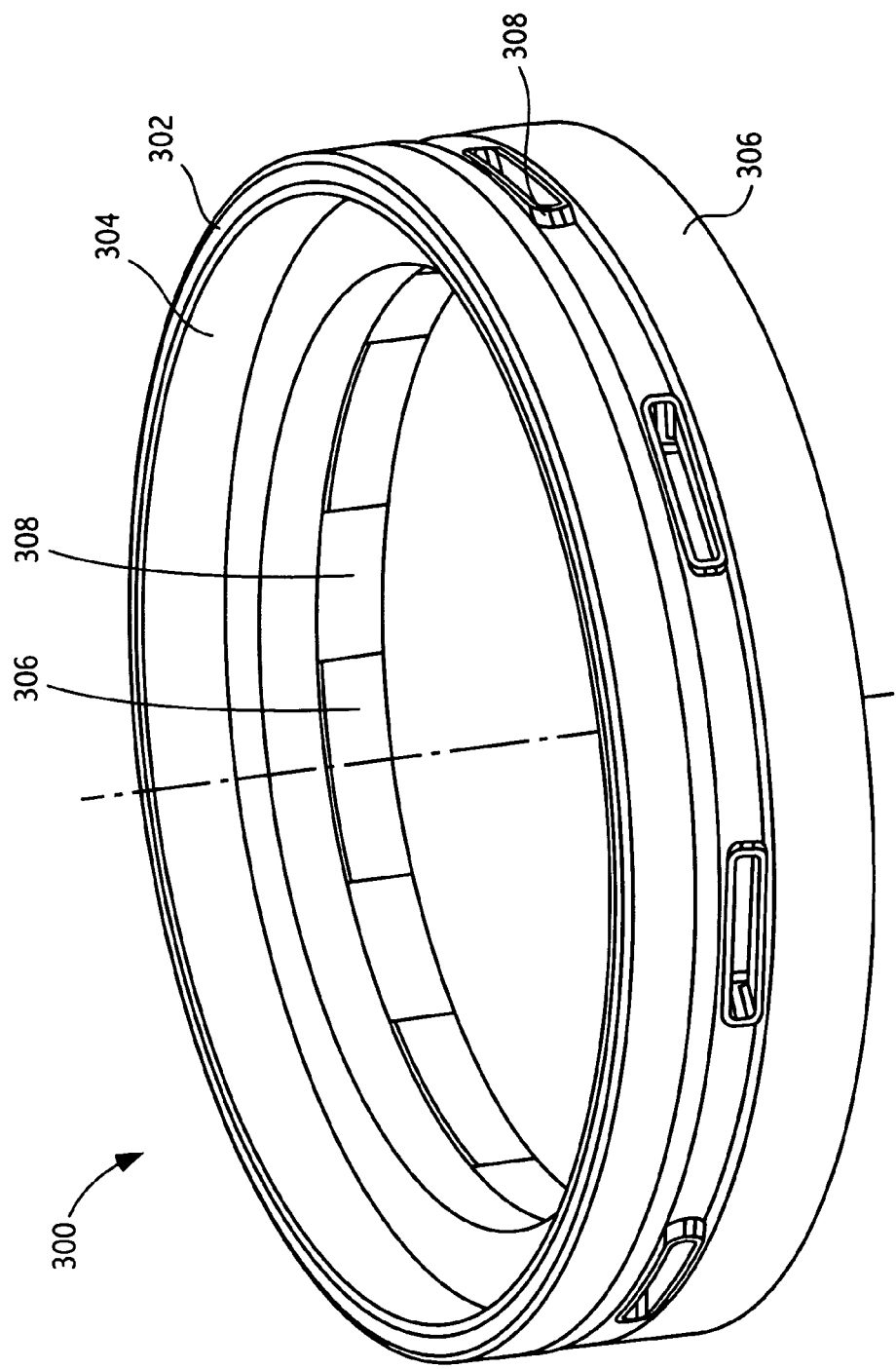
FIG. 6A illustrates a perspective view of a vestibule assembly in accordance with an alternative embodiment of the present invention.

Now making reference to FIG. 6A, FIG. 6A illustrates a perspective view of a vestibule assembly 300 in accordance with an alternative embodiment of the present invention. The vestibule assembly 300 includes an end vestibule retainer ring 302, an outer vestibule 304 and an inner vestibule 306. The vestibule assembly 300 also includes a cooling port 308 disposed within the outer vestibule 304 and the inner vestibule 306. It should be noted that process chambers employing the vestibule assembly 300 typically use two vestibule assemblies 300 disposed at either end of the process chamber, as previously discussed with reference to FIG. 2, the forced-air cooling process chamber 200 and the vestibule assemblies 222a and 222b. Likewise, the two vestibule assemblies 300 are in fluid communication with the flow passage 201 of the forced-air cooling process chamber 200.

Figure 6B:
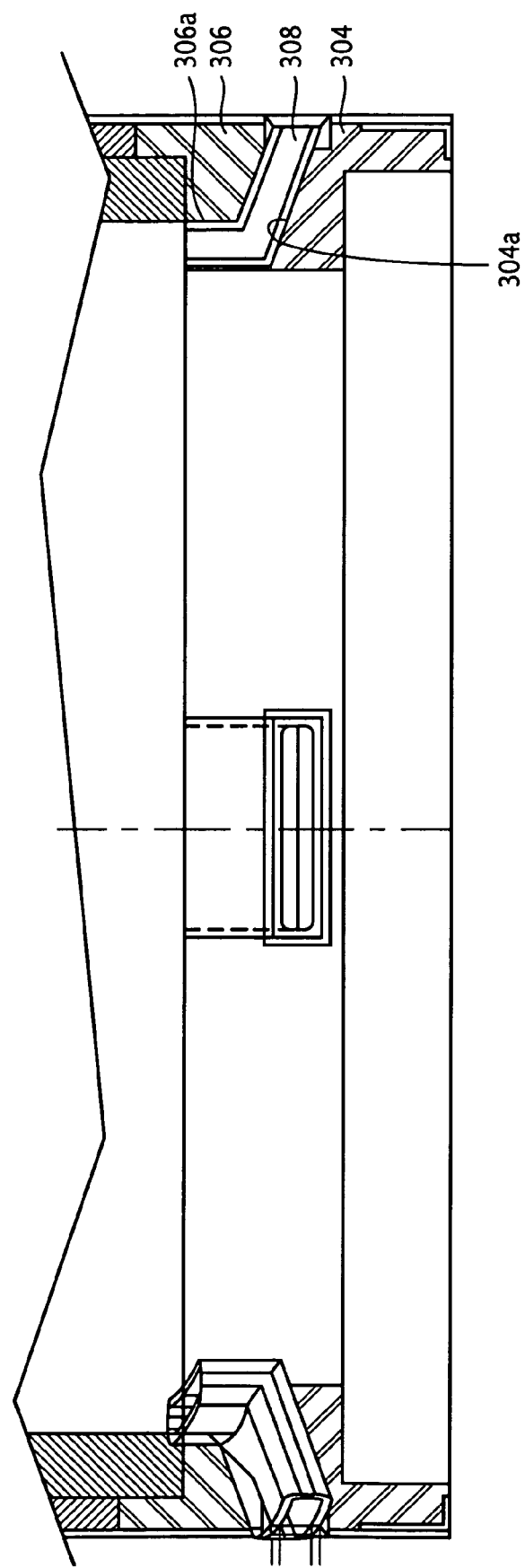
FIG. 6B is a cross sectional view of the vestibule assembly shown with respect to FIG. 6A in accordance with an embodiment of the present invention.

The outer vestibule 304 is axially superimposed onto the inner vestibule 306 during integration of the vestibule assembly 300, as may be seen with reference to FIG. 6B. FIG. 6B is a cross-sectional view of the vestibule assembly 300 shown with respect to FIG. 6A in accordance with an embodiment of the present invention. Upon integration of the vestibule assembly 300, the cooling port 308 sits within grooves (shown with reference to FIGS. 8 and 9A) of the outer vestibule 304 and the inner vestibule 306. As may be seen, the cooling port 308 is unitary piece which provides a high flow rate within a low profile. The high flow rate allows for fitment of a larger process chamber with the vestibule assembly 300. In addition, the cooling port 308 is press fit into the vestibule assembly 300 during fabrication thereby obviating the need for cement or other adhesives for retention typically used during vestibule assembly fabrication. The cooling port 308 is also trapped within the vestibule assembly 300 between the outer vestibule 304 and the inner vestibule 306, thereby minimizing the possibility of dislodgement of the cooling port 308 during operation of a process chamber implementing the vestibule assembly 300.

Figure 7:
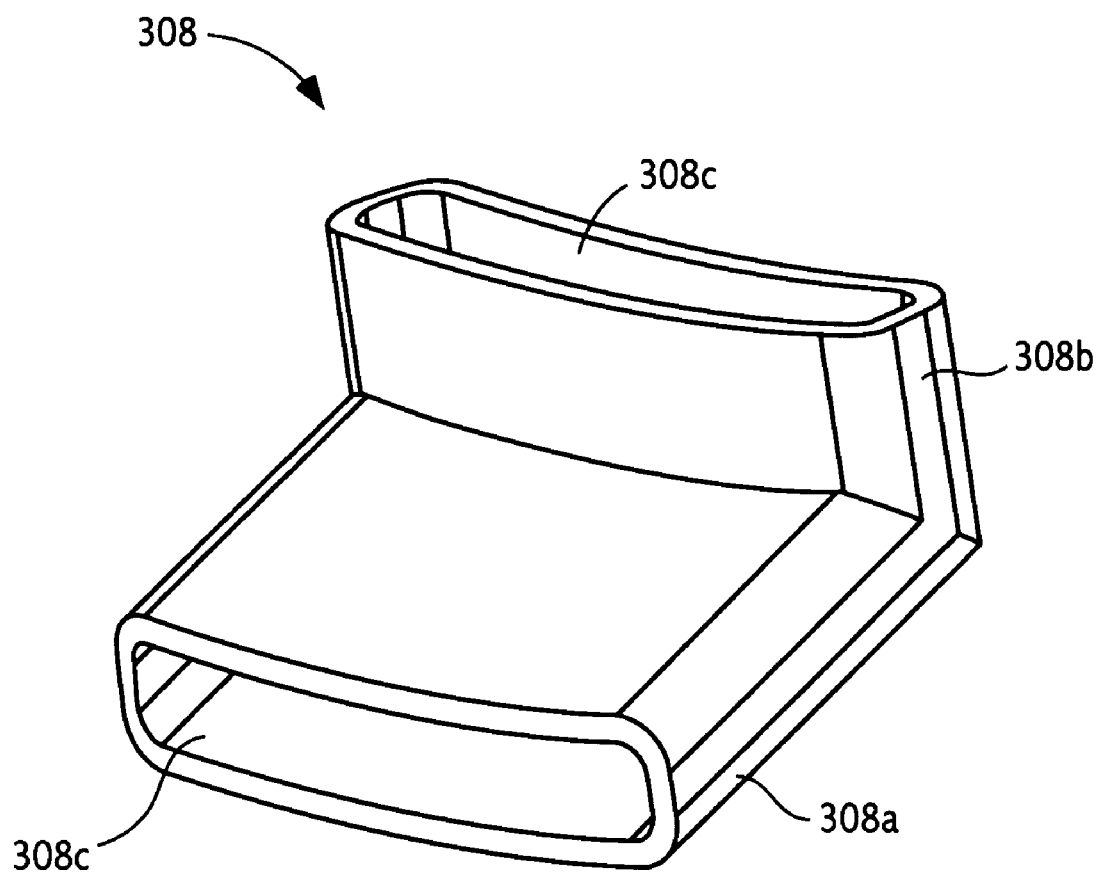
FIG. 7 is a perspective view of the cooling port shown with reference to FIG. 6A in accordance with an exemplary embodiment of the present invention.

As more clearly shown with respect to FIG. 6, the cooling port 308 has a configuration which allows for entry of a temperature adjusting medium, such as air, through the vestibule assembly 300 and into the forced-air cooling process chamber 200. Therefore, the cooling port 308 provides fluid communication between the vestibule assembly 300 and the flow passage 201 of the forced-air cooling process chamber 200. The cooling port 308 is a unitary piece which includes a section 308b integrated with a section 308a as shown with reference to FIG. 7. Additionally, the cooling port 308 includes a port 308c disposed through the sections 308a and 308b of the cooling port 308. The port 308c allows for the passage of a temperature adjusting medium through the port 308 and into the flow passage 201. In accordance with an embodiment of the present invention, the cooling port 308 may be machined or may be constructed with iso-pressed high purity ceramic. In an embodiment where the cooling port 308 is constructed of iso-pressed high purity ceramic, the iso-pressed high purity ceramic may include 96% or greater alumina or the like. The cooling port 308 sits within grooves 306a of the inner vestibule 306 as shown with reference to FIG. 8.

Figure 8:
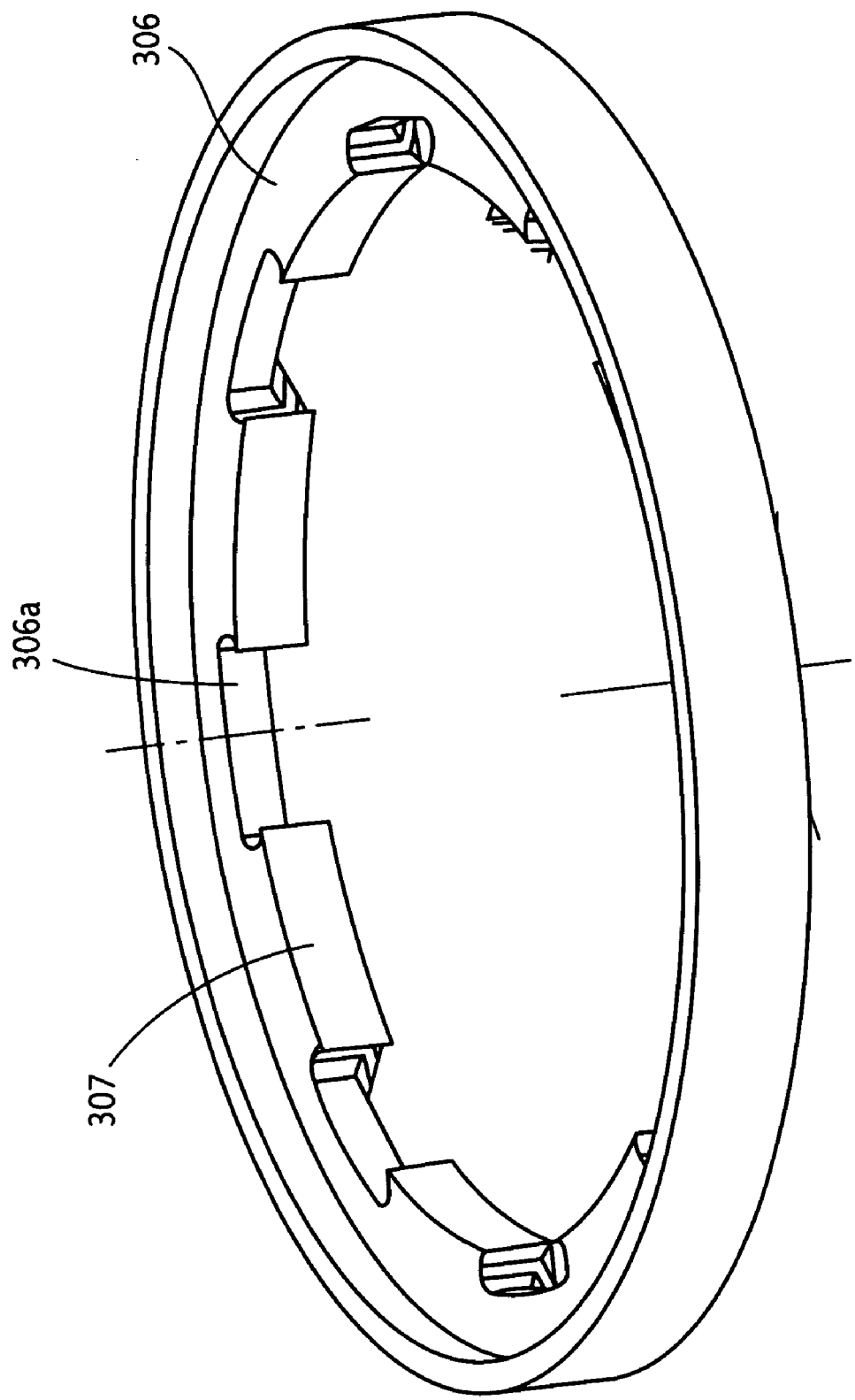
FIG. 8 illustrates a perspective view of the inter vestibule as shown with respect to FIG. 6A, in accordance with an alternative embodiment of the present invention.

FIG. 8 illustrates a perspective view of the inner vestibule 306 shown with respect to FIG. 6A, in accordance with an alternative embodiment of the present invention. The inner vestibule 306 includes grooves 306a machined into the inner vestibule 306 during fabrication of the inner vestibule 306. As may be seen with reference to the Figure, the grooves 306a are opened in a radially outer direction of the inner vestibule 306 relative to a radial surface 307 of the inner vestibule 306. Moreover, the grooves 306a are formed in an axially inner direction and allow passage of a temperature adjusting medium in an axial direction relative to the radial surface 307, as may be seen with reference to FIG. 8. It should be noted that the inner vestibule 306 may be made from a ceramic fiber such as vacuum formed ceramic fiber or the like.

Figure 9A:
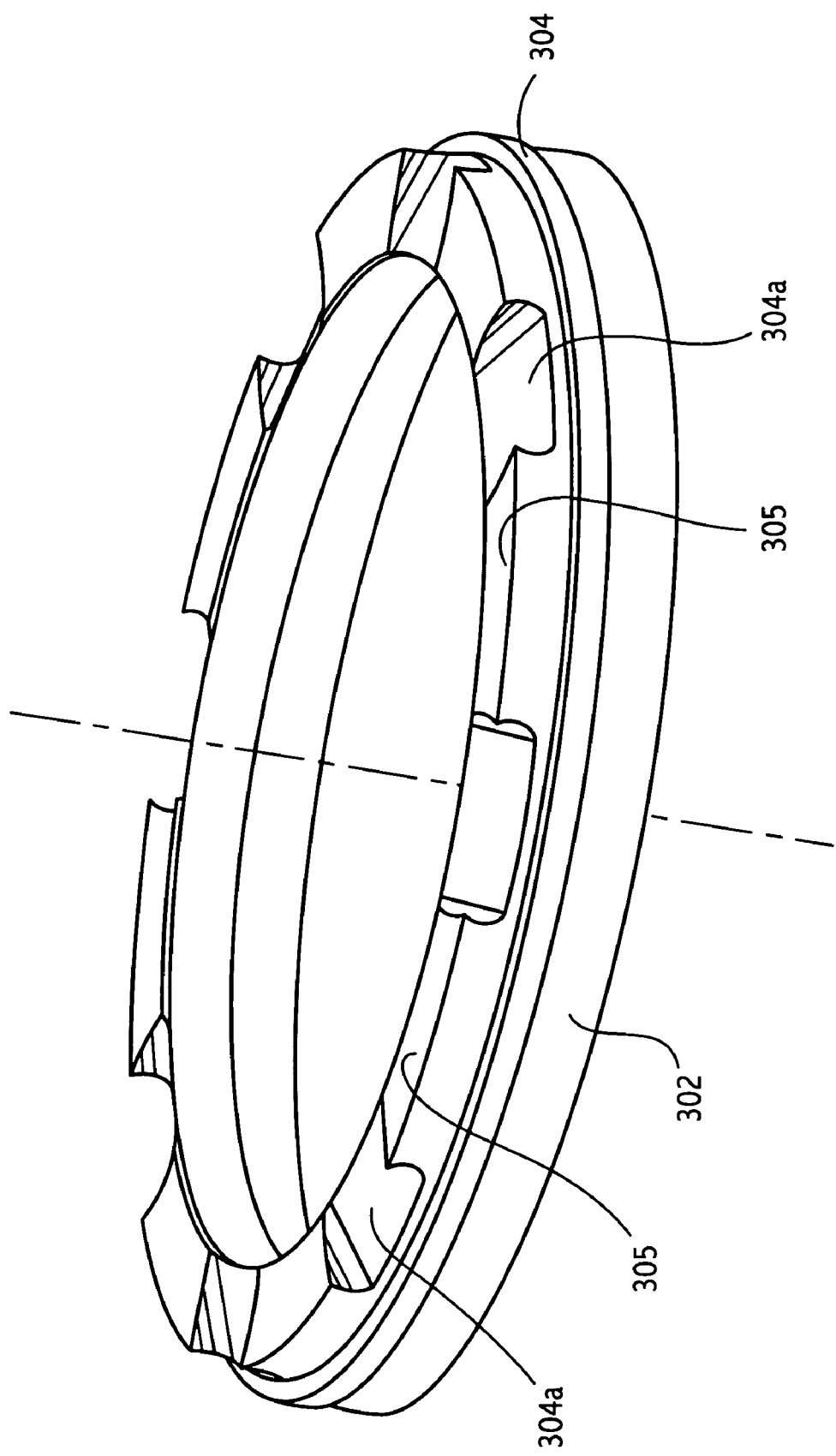
FIG. 9A is a perspective view of the outer vestibule and the end vestibule retainer ring shown with reference to FIG. 6A in accordance with an embodiment of the present invention.

Now making reference to FIG. 9A, FIG. 9A illustrates a perspective view of the outer vestibule 304 and the end vestibule retainer ring 302 shown with reference to FIG. 6A in accordance with an embodiment of the present invention. The groove 304a is machined into the outer vestibule 304 during fabrication of the outer vestibule 304. As may be seen with reference to FIG. 9A, the groove 304a extends in both a radially outward direction and an axially inward direction relative to an axial surface 305 of the outer vestibule 304. The outer vestibule assembly 304 may be constructed from a composite section of ceramic fiber. An example of a ceramic fiber which may be used includes vacuum formed ceramic fiber or the like.

It should be noted that the vestibule assembly may be placed at an intermediate section of a forced-air cooling process chamber, as discussed with reference to the third vestibule assembly 211 and the forced-air cooling process chamber 200. More specifically, the third vestibule assembly 211 of the forced-air cooling process chamber 200 may include the vestibule assembly 300 such that the forced-air cooling process chamber 200 includes the vestibule assembly at both ends thereof and at an intermediate section of the forced-air cooling process chamber 200 thereby allowing individual control of the previously described heating zones 207a and 207b.

Figure 9B:
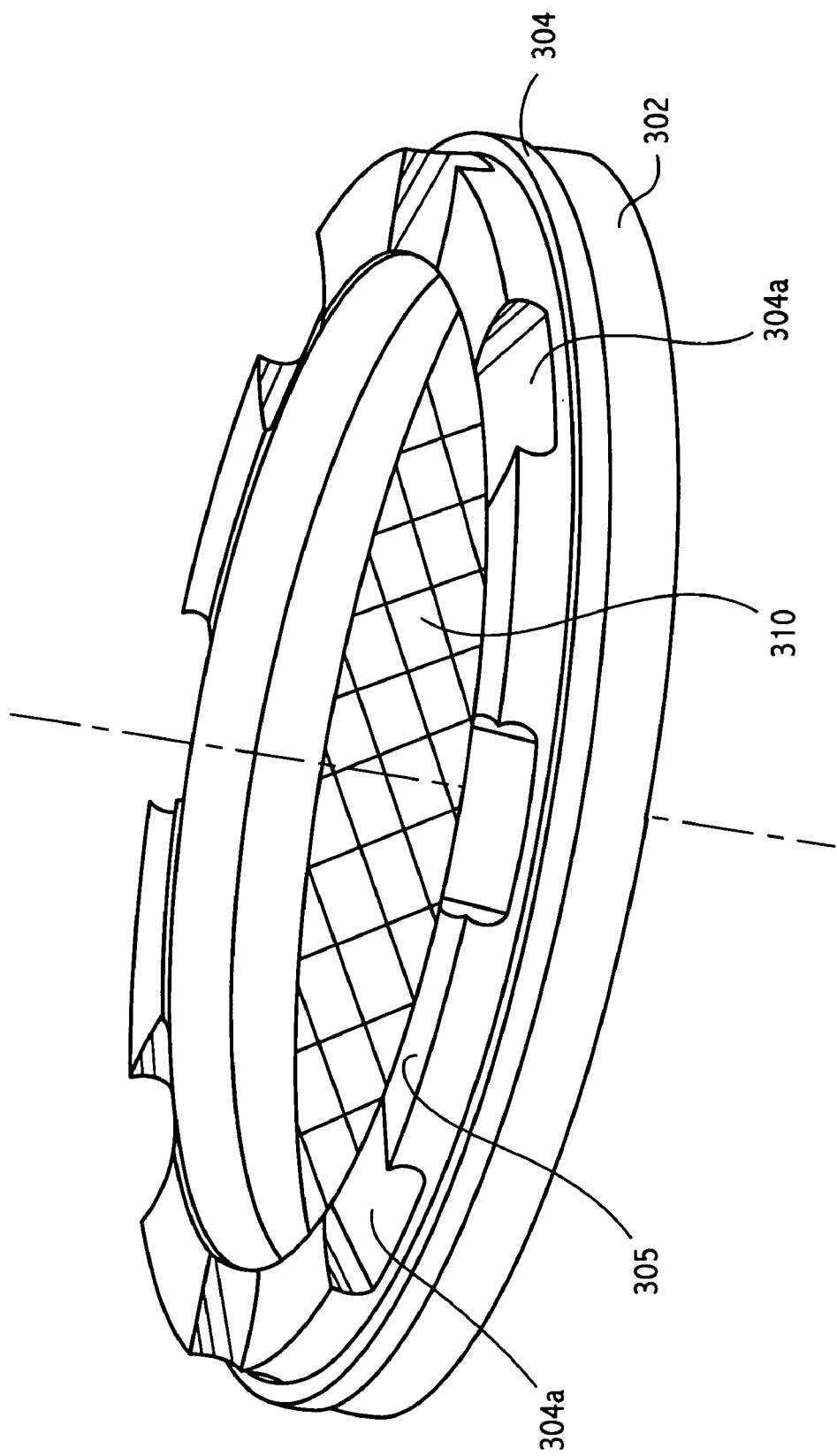
FIG. 9B is an embodiment of the present invention illustrating a perspective view of the outer vestibule assembly of FIG. 9A with an end cap.

The vestibule assembly 300 may be used in a variety of processing furnaces, including a batch furnace. In an embodiment where the vestibule assembly 300 is used with a batch furnace where the batch furnace includes the vestibule assembly 300 on either end of the batch furnace, one of the vestibule assemblies 300 may include an end cap 310, as shown with respect to FIG. 9B. In an embodiment where the vestibule assembly 300 is used with a batch furnace, the end cap 310 may have an active heating element or a passive insulator. Examples of an active heating element which may be used include a resistive wire, a top heater for a vertical batch furnace or the like. In an embodiment where the end cap 310 has a passive insulator, an example of a passive insulator that may be used includes a vacuum formed ceramic fiber plug.

In this embodiment, the vestibule assembly 300 minimizes the amount of parts used while increasing the airflow capacity of the vestibule assembly 300. Moreover, machining of the grooves 304a and 306a into the outer vestibule 304 and the inner vestibule 306 during fabrication of both the outer vestibule 304 and the inner vestibule 306 minimizes labor and craftsmanship associated with the vestibule assembly 300. In addition, the cooling ports 308 reduce a cross-section footprint for airflow capacity through the vestibule assembly 300. As discussed with reference to FIG. 2 and the vestibule assemblies 222, upon fitment of the vestibule assemblies 300 onto the process chamber 200, the vestibules assembly 300 are offset on the process chamber 200 such that the cooling ports 308 are at an offset relative to one another. In accordance with an embodiment of the present invention, the offset of the cooling ports 308 may be in a range preferably between about half the angular distance between the injection points in order to maximize the distance from the fluid flow injection and the fluid flow extraction. As may be appreciated, the offset between the vestibule assemblies within the forced-air cooling process chamber 200 allows uniform cooling along the process chamber 207. Likewise, the offset between the vestibule assemblies enhances uniformity of cooling by creating a spiral fluid flow path. It should be noted that the offset may be angled to further enhance the spiral fluid flow path effect.

Figure 10A:
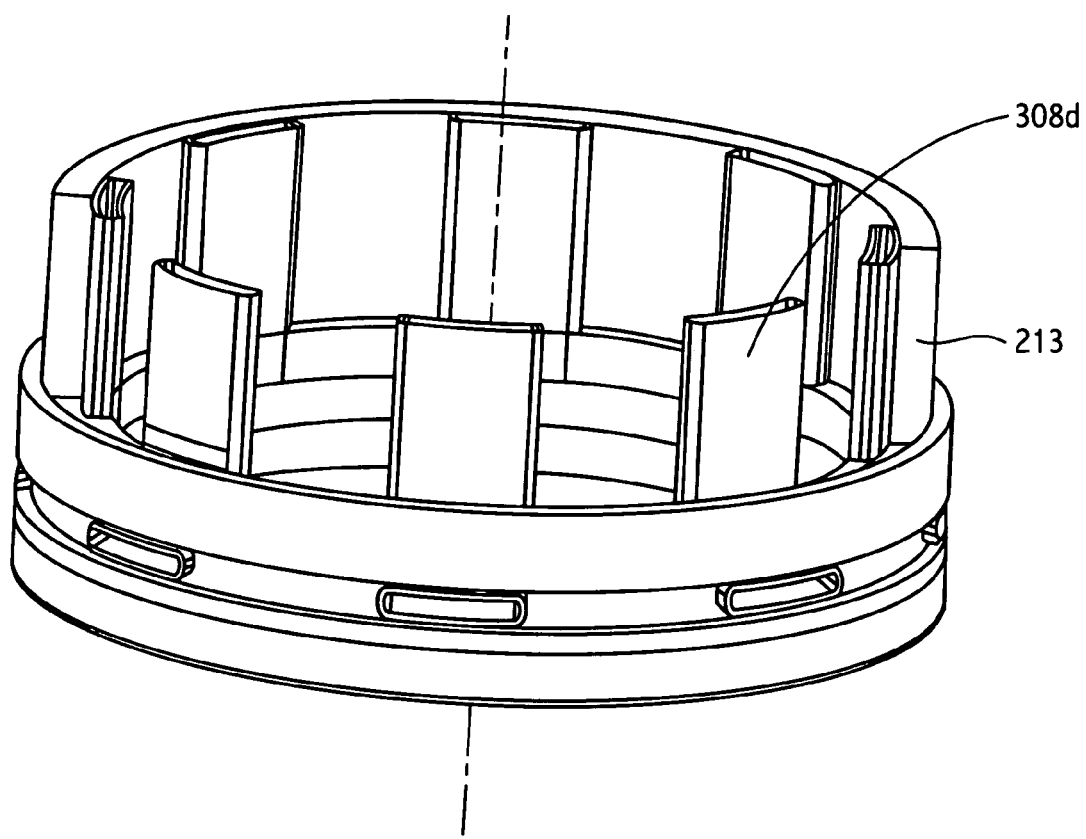
FIG. 10A illustrates a perspective view of a vestibule assembly in accordance with an alternative embodiment of the present invention.
Figure 10B:
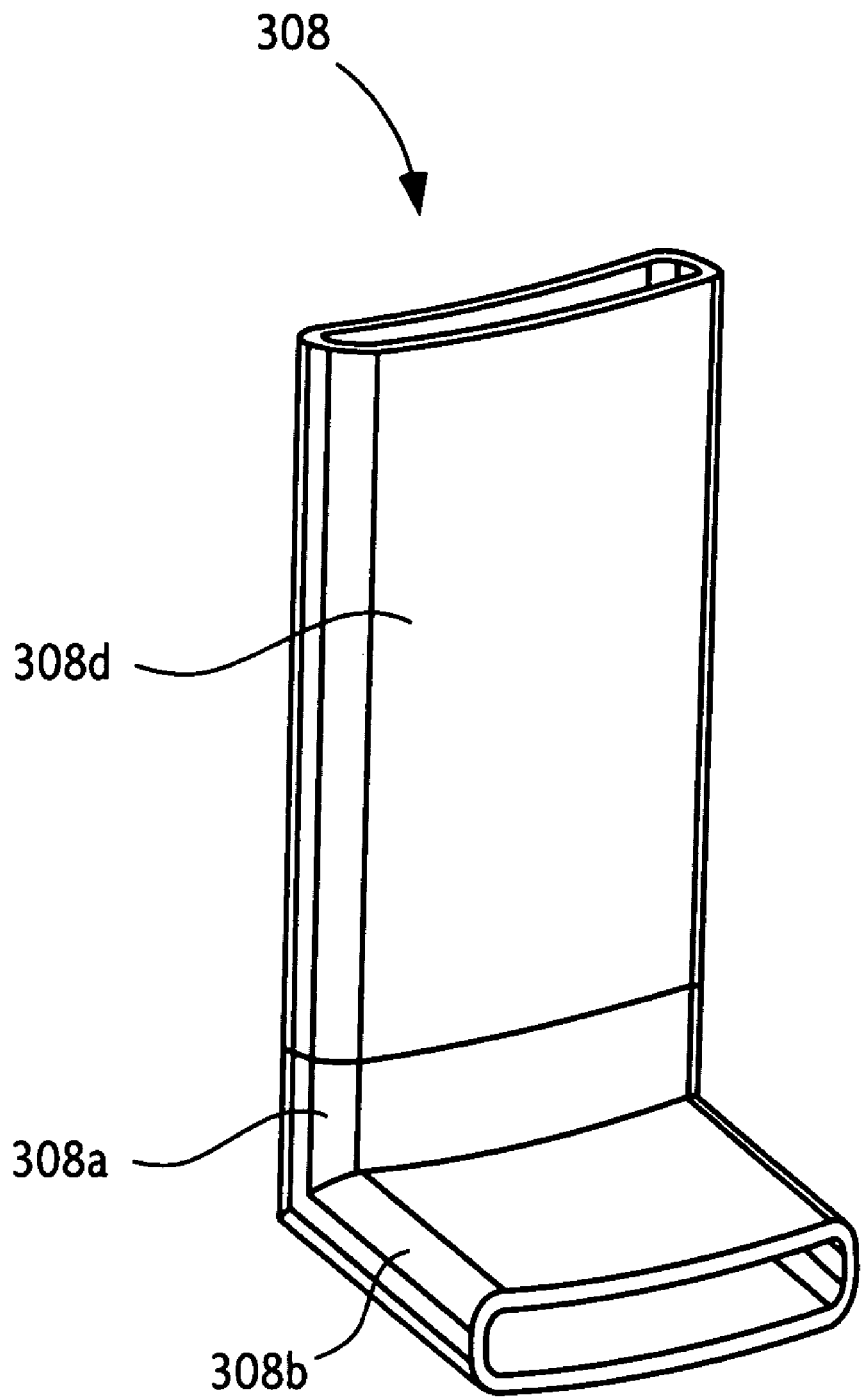
FIG. 10B is a perspective view of the cooling ports shown with reference to FIG. 10A in accordance with an alternative embodiment of the present invention.

Now making reference to FIG. 10A, FIG. 10A illustrates a perspective view of a vestibule assembly in accordance with an alternative embodiment of the present invention. In this embodiment, the cooling ports 308 include a section 308d rigidly attached to the section 308a of the cooling port 308, as may be seen more clearly with reference to FIG. 10B. It should be noted that in an alternative embodiment of the present invention, the section 308d may also be inserted into the section 308a of the cooling port 308. The section 308d further extends the cooling port 308. As may be seen with reference to FIG. 10A, the section 308d passes through a buffer zone 213 of the forced-air cooling process chamber 200. As such, during operation of the forced-air cooling process chamber 200, a temperature adjusting medium is injected into the vestibule assembly 300 and then directly into the process chamber 207. Therefore, thermal losses associated with passing the temperature adjusting medium through the buffer zone 213 are minimized, thereby increasing the overall efficiency of the forced-air cooling process chamber 200.

In an embodiment where the cooling ports include sections extending through the buffer zone 213, the cooling ports 308 introduce a temperature adjusting medium beyond the buffer zone 213. Therefore, the temperature adjusting medium flows across the buffer zone 213 and into the heating zones 207a and 207b where a majority of cooling occurs. As may be appreciated, the buffer zones 213 compensate for end losses typically associated with openings to the outside of the forced-air cooling process chamber 200, such as a bottom end in an embodiment where the forced-air cooling process chamber 200 is a vertical furnace where the bottom end tends to cool faster than the center of the forced-air cooling process chamber 200.

In order to allow uniform cooling of the forced-air cooling process chamber 200, the buffer zones 213 supply heat to compensate for greater heat loss associated with the ends of the forced-air cooling process chamber 200. As a result of the flow of the temperature adjusting medium being directly coupled to the buffer zone 213, the heating and cooling may be in direct opposition with each other. The direct opposition of the heating and cooling may lead to excessive wear and premature failure in the buffer zone 213 as well as decreased overall cooling performance of the forced-air cooling process chamber 200.

Where the cooling ports 308 include the sections 308d, the point of injecting the temperature adjusting medium into the forced-air cooling process chamber 200 is extended such that injection occurs between the buffer zone 213 and the process chamber 207. As injection of the temperature adjusting medium occurs above the buffer zone 213, the temperature adjusting medium is effectively decoupled from the buffer zone 213. Thus, heating action of the buffer zone 213 acts independently and compensates for furnace end-loss more efficiently manner while allowing maximum cooling effect of the temperature adjusting medium within the forced-air cooling process chamber 200 inboard of the buffer zone 213. The net result enhances element life and increases cooling performance.

Figure 11:
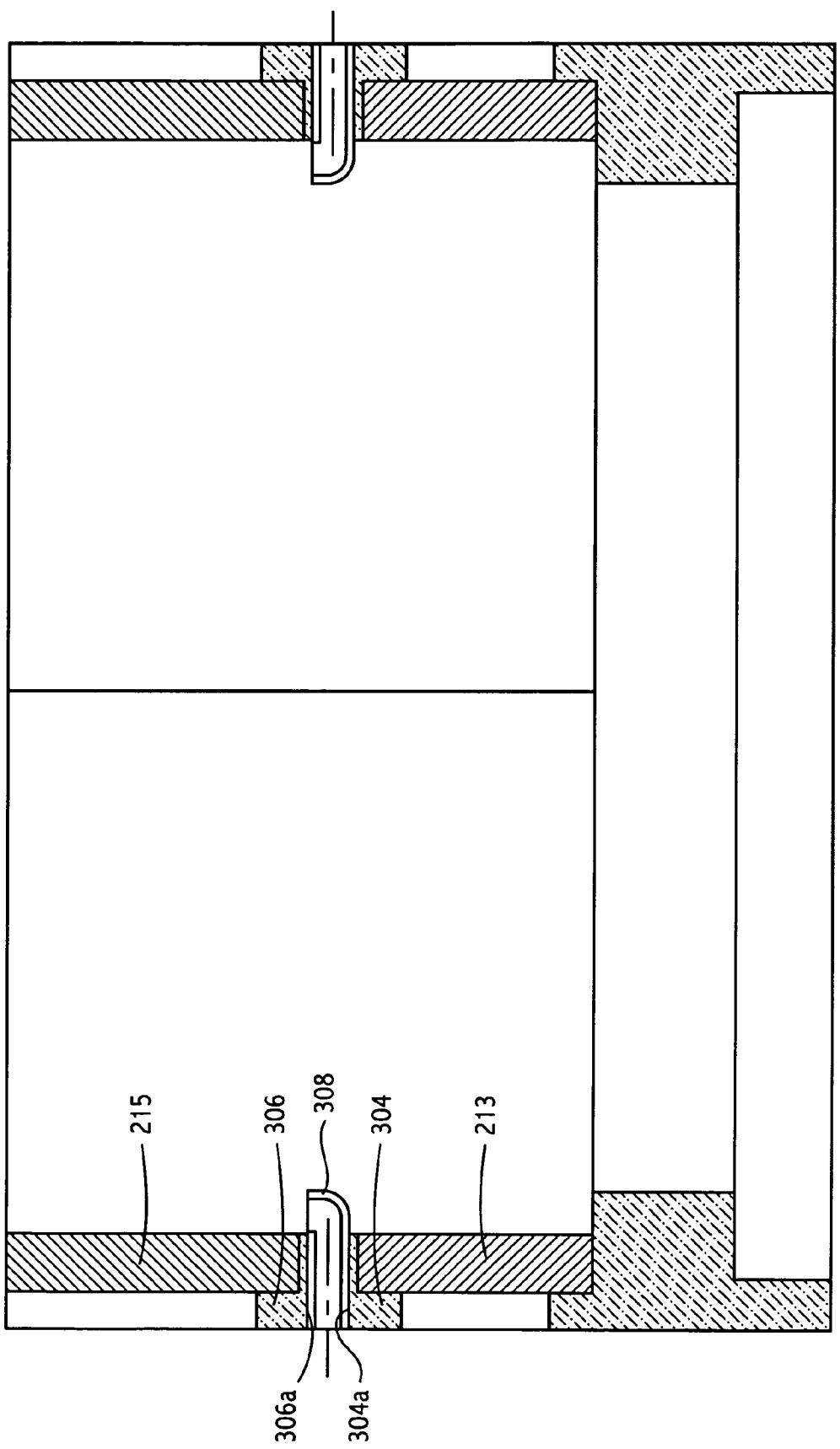
FIG. 11 is a sectional view showing a vestibule assembly positioned between a buffer zone of a process chamber and process zone of a process chamber.

Now making reference to FIG. 11, FIG. 11 is a sectional view showing a vestibule assembly positioned between the buffer zone 213 of the process zone 215 of the forced-air cooling process chamber 200. In this embodiment, the entire forced air cooling assembly has been placed inside the buffer zone 213. As such, fluid flow of a temperature adjusting means is effectively decoupled from heating action of the buffer zone 213. Additionally, this configuration eliminates the need for the section 308d discussed with reference to FIGS. 10A and 10B. As may be seen, the inner and outer vestibules 304 and 306 include radial grooves 304a and 306a. The cooling port 308 sits within the radial grooves 304a and 306a As may be appreciated, the present invention provides an attractive alternative to designers of forced-air cooling process chambers. The present invention minimizes the problems associated with prior art vestibule assemblies. More particularly, the present invention minimizes particulate generation and contamination of a process chamber during operation of the process chamber. Moreover, the vestibule assemblies of the present invention are made of a unitary piece, thereby providing a robust apparatus. As such, costs associated with the present invention are greatly reduced and overall reliability of process chambers using the present invention is greatly increased.

In addition, the one-piece ceramic configuration of the vestibule assemblies do not include an internal seam which may separate during use thereby leading to particulate contamination. In addition, the one-piece configuration minimizes the possibility of imperfect formation during fabrication associated with two-piece configurations which may potentially contaminate a process chamber.

The above are exemplary modes of carrying out the invention and are not intended to be limiting. It will be apparent to those of ordinary skill in the art that modifications thereto can be made without departure from the spirit and scope of the invention as set forth in the accompanying claims.

What is claimed is:

1. A forced-air cooling process chamber for heat treating a product, the forced-air cooling process chamber comprising:
    a housing;
    a flow passage disposed about a periphery of the housing, the flow passage allowing for a flow of a temperature adjusting medium about the periphery of the housing; and
    a vestibule assembly disposed at a first end of the housing, the vestibule assembly being in fluid communication with the flow passage, the vestibule assembly comprising:
        an axially outer ring, the axially outer ring having a first groove, the first groove being formed in an axially inwardly facing surface of the axially outer ring, the first groove having at least a portion being open in both a radially outer direction and an axially inner direction; and
        an axially inner ring, the axially inner ring having a second groove, the second groove being formed in an axially outwardly facing surface of the axially inner ring and open in an axially inner direction where the first groove and the second groove form a passageway when the first groove and the second groove are placed in an axially superimposed relationship, the passageway having a radially outwardly open end formed by the first groove and an axially inwardly facing end formed by the second groove, the passageway being in fluid communication with the flow passage thereby allowing passage of the temperature adjusting medium wherein the flow passage and the vestibule assembly provide low particulate contamination within the forced-air cooling process chamber.

2. A forced-air cooling process chamber for heat treating a product as recited in claim 1, wherein the housing includes a second end with a second vestibule assembly disposed at the housing second end.

3. A forced-air cooling process chamber for heat treating a product as recited in claim 2, the second vestibule assembly further including:
    an axially outer ring having a groove and an axially inner ring having a groove wherein the second vestibule assembly axially outer ring groove and the second vestibule assembly axially inner ring groove form a passageway upon superimposition of the second vestibule assembly axially outer ring with the second vestibule assembly axially inner ring.

4. A forced-air cooling process chamber for heat treating a product as recited in claim 3, wherein the second vestibule assembly passageway fluidly communicates with the flow passage thereby allowing passage of the temperature adjusting medium from the flow passage.

5. A forced-air cooling process chamber for heat treating a product as recited in claim 3, wherein the vestibule assembly is offset from the second vestibule assembly thereby allowing uniform temperature adjustment of the forced-air cooling process chamber.

6. A forced-air cooling process chamber for heat treating a product as recited in claim 5, wherein the offset is half an angular distance between the vestibule assembly passageway and the second vestibule assembly passageway.

7. A forced-air cooling process chamber for heat treating a product as recited in claim 5 further comprising:
    a third vestibule assembly disposed intermediate the housing first end and the housing second end, the third vestibule assembly including an axially outer ring having a groove and an axially inner ring having a groove wherein the third vestibule assembly axially outer ring groove and the third vestibule assembly axially inner ring groove form a passageway upon superimposition of the third vestibule assembly axially outer ring with the third vestibule assembly axially inner ring.

8. A forced-air cooling process chamber for heat treating a product as recited in claim 1, wherein the axially outer ring groove is disposed about a periphery of the first ring.

9. A forced-air cooling process chamber for heat treating a product as recited in claim 1, wherein the axially inner ring groove is disposed about a periphery of the second ring.

10. A forced-air cooling process chamber for heat treating a product as recited in claim 1, wherein the axially outer ring and the axially inner ring are molded ceramic fiber.

11. A forced-air cooling process chamber for heat treating a product as recited in claim 1, wherein the vestibule assembly forms an end cap for the forced-air cooling process chamber.

12. A forced-air cooling process chamber for heat treating a product as recited in claim 1, wherein the temperature adjusting medium is air.

13. A forced-air cooling process chamber for heat treating a product as recited in claim 1, the axially outer ring further comprising:
    a heating element disposed therein where the heating element controls a temperature within a portion of the forced-air cooling process chamber.

14. A forced-air cooling process chamber for heat treating a product as recited in claim 1, the axially inner ring further comprising:
    a heating element disposed therein where the heating element controls a temperature within a portion of the forced-air cooling process chamber.

15. A forced-air cooling process chamber for heat treating a product comprising:
    a housing, the housing having a first end;
    a flow passage disposed about a periphery of the housing, the flow passage allowing passage of a temperature adjusting medium about the forced-air cooling process chamber for heat treating a product; and a vestibule assembly coupled with the flow passage, the vestibule assembly being at the housing first end, the vestibule assembly including:
  a first ring having a groove, the first ring groove being axially and radially disposed with respect to the first ring where at least a portion of the first ring groove is partially blocked in both an axial direction and a radial direction relative to the first ring, the first ring groove being in fluid communication with the flow passage; and
  a second ring having a groove, the second ring groove being axially and radially disposed with respect to the second ring where at least a portion of the second ring groove is partially blocked in an axial direction relative to the second ring, the second ring groove being in fluid communication with the flow passage, where the first ring and the second ring interface with one another such that the first ring groove and the second ring groove align with one another to form a passageway which allows flow of the temperature adjusting medium from the flow passage wherein the flow passage and the vestibule assembly provide low particulate contamination within the forced-air cooling process chamber.

16. A forced-air cooling process chamber for heat treating a product as recited in claim 15, wherein the temperature adjusting medium regulates a temperature of the forced-air cooling process chamber for heat treating a product.

17. A forced-air cooling process chamber for heat treating a product as recited in claim 15, wherein the first ring has a circular configuration.

18. A forced-air cooling process chamber for heat treating a product as recited in claim 17, wherein the first ring groove is disposed about a periphery of the first ring.

19. A forced-air cooling process chamber for heat treating a product as recited in claim 15, wherein the second ring has a circular configuration.

20. A forced-air cooling process chamber for heat treating a product as recited in claim 19, wherein the second ring groove is disposed about a periphery of the second ring.

21. A forced-air cooling process chamber for heat treating a product as recited in claim 15, wherein the first ring and the second ring are molded ceramic fiber.

22. A forced-air cooling process chamber for heat treating a product as recited in claim 15, wherein the temperature adjusting medium is air.

23. A forced-air cooling process chamber for heat treating a product as recited in claim 15, wherein the housing further comprises a second end.

24. A forced-air cooling process chamber for heat treating a product as recited in claim 23, the forced-air cooling process chamber for heat treating a product further comprising:
  a second vestibule assembly disposed at the housing second end, the second vestibule assembly comprising:
    a first ring having a groove, the second vestibule assembly first ring groove being axially and radially disposed with respect to the second vestibule assembly first ring, the second vestibule assembly first ring groove being in fluid communication with the flow passage; and
    a second ring having a groove, the second vestibule assembly second ring groove being axially and radially disposed with respect to the second vestibule assembly second ring where at least a portion of the second vestibule assembly second ring groove is partially blocked in an axial direction relative to the second vestibule assembly second ring, the second vestibule assembly second ring groove being in fluid communication with the flow passage where the second vestibule assembly first ring and the second vestibule assembly second ring interface with one another such that the second vestibule assembly first ring groove and the second vestibule assembly second ring groove align with one another to form a passageway which allows flow of the temperature adjusting medium from the flow passage wherein the flow passage and the second vestibule assembly provide low particulate contamination within the forced-air cooling process chamber.

25. A forced-air cooling process chamber for heat treating a product as recited in claim 24, wherein the vestibule assembly is offset from the second vestibule assembly thereby allowing uniform temperature adjustment through the forced-air cooling process chamber.

26. A forced-air cooling process chamber for heat treating a product as recited in claim 25, the forced-air cooling process chamber for heat treating a product further comprising:
  a third vestibule assembly disposed intermediate both the vestibule assembly and the second vestibule assembly, the third vestibule assembly comprising:
    a first ring having a groove, the third vestibule assembly first ring groove being axially and radially disposed with respect to the third vestibule assembly first ring, the third vestibule assembly first ring groove being in fluid communication with the flow passage; and
    a second ring having a groove, the third vestibule assembly second ring groove being axially and radially disposed with respect to the third vestibule assembly second ring where at least a portion of the third vestibule assembly second ring groove is partially blocked in an axial direction relative to the third vestibule assembly second ring, the third vestibule assembly second ring groove being in fluid communication with the flow passage where the third vestibule assembly first ring and the third vestibule assembly second ring interface with one another such that the third vestibule assembly first ring groove and the third vestibule assembly second ring groove align with one another to form a passageway which allows flow of the temperature adjusting medium from the flow passage wherein the flow passage and the third vestibule assembly provide low particulate contamination within the forced-air cooling process chamber.

27. A forced-air cooling process chamber for heat treating a product as recited in claim 25, wherein the offset is half an angular distance between the vestibule assembly passageway and the second vestibule assembly passageway.

28. A forced-air cooling process chamber for heat treating a product as recited in claim 15, wherein the vestibule assembly forms an end cap for the forced-air cooling process chamber.

29. A forced-air cooling process chamber for heat treating a product as recited in claim 15, wherein the first ring further comprises:
  a heating element disposed therein where the heating element controls a temperature within a portion of the forced-air cooling process chamber.

30. A forced-air cooling process chamber for heat treating a product as recited in claim 15, wherein the second ring further comprises:

a heating element disposed therein where the heating element controls a temperature within a portion of the forced-air cooling process chamber.

31. A forced-air cooling process chamber for heat treatment of a product comprising:
- a housing having a first end and a second end;
- a flow passage disposed about a periphery of the housing, the flow passage extending from the housing first end to the housing second end, the flow passage allowing for the passage of a temperature adjusting medium between the housing first end and the housing second end;
- a first vestibule assembly disposed at the housing first end, the first vestibule assembly comprising:
  - an axially outer ring, the axially outer ring having a first groove, the first groove being formed in an axially inwardly facing surface of the axially outer ring, the first groove having at least a portion being open in both a radially outer direction and an axially inner direction; and
  - an axially inner ring, the axially inner ring having a second groove, the second groove being formed in an axially outwardly facing surface of the axially inner ring and open in an axially inner direction where the first groove and the second groove form a passageway when the first groove and the second groove are placed in an axially superimposed relationship, the passageway having a radially outwardly open end formed by the first groove and an axially inwardly facing end formed by the second groove, the passageway being in fluid communication with the flow passage thereby allowing passage of the temperature adjusting medium wherein the flow passage and the vestibule assembly provide low particulate contamination within the forced-air cooling process chamber;
- a second vestibule assembly disposed at the second end, the second vestibule assembly having an axially outer ring having a groove and an axially inner ring having a groove wherein the second vestibule assembly axially outer ring groove and the second vestibule assembly axially inner ring groove form a passageway upon superimposition of the second vestibule assembly axially outer ring with the second vestibule assembly axially inner ring, the second vestibule assembly being in fluid communication with the flow passage such that the temperature adjusting means travels between the first and second vestibule assemblies.

32. A forced-air cooling process chamber for heat treating a product as recited in claim 31 further comprising:
- a third vestibule assembly disposed intermediate the housing first end and the housing second end, the third vestibule assembly including an axially outer ring having a groove and an axially inner ring having a groove wherein the third vestibule assembly axially outer ring groove and the third vestibule assembly axially inner ring groove form a passageway upon superimposition of the third vestibule assembly axially outer ring with the third vestibule assembly axially inner ring.

33. A forced-air cooling process chamber for heat treating a product as recited in claim 31, wherein the first vestibule assembly is offset from the second vestibule assembly thereby allowing uniform temperature adjustment throughout the forced-air cooling process chamber.

34. A forced-air cooling process chamber for heat treating a product as recited in claim 33, wherein the offset is half an angular distance between the vestibule assembly passageway and the second vestibule assembly passageway.

35. A forced-air cooling process chamber for heat treating a product as recited in claim 34, wherein the vestibule assembly passageway is formed at an angle relative to an axial direction of the forced-air cooling process chamber.

36. A forced-air cooling process chamber for heat treating a product as recited in claim 35, wherein the second vestibule assembly passageway is formed at the angle.

37. A forced-air cooling process chamber for heat treating a product as recited in claim 31, wherein the temperature adjusting medium is air.

38. A forced-air cooling process chamber for heat treating a product, the forced-air cooling process chamber comprising:
- a housing;
- a flow passage disposed about a periphery of the housing, the flow passage allowing for a flow of a temperature adjusting medium about the periphery of the housing; and
- a vestibule assembly disposed at a first end of the housing, the vestibule assembly being in fluid communication with the flow passage, the vestibule assembly comprising:
  - an outer vestibule, the outer vestibule having a first groove, the first groove being formed in an axially inwardly facing surface of the outer vestibule, the first groove having at least a portion being open in both a radially outer direction and an axially inner direction; and
  - an inner vestibule, the inner vestibule having a second groove, the second groove being formed in a radially facing surface of the inner vestibule and open in an axially inner direction where a cooling port is placed within the first groove and the second groove when the first groove and the second groove are placed in an axially superimposed relationship, the first groove and the second groove rigidly holding the cooling port between the inner vestibule and the outer vestibule, the cooling port being in fluid communication with the flow passage thereby allowing passage of the temperature adjusting medium wherein the cooling port is a unitary piece such that the flow passage and the vestibule assembly provide low particulate contamination within the forced-air cooling process chamber.

39. A forced-air cooling process chamber for heat treating a product as recited in claim 38, wherein the housing includes a second end with a second vestibule assembly disposed at the housing second end.

40. A forced-air cooling process chamber for heat treating a product as recited in claim 39, the second vestibule assembly further including:
- an outer vestibule having a groove and an inner vestibule having a groove wherein an additional cooling port is placed within the second vestibule assembly outer vestibule groove and the second vestibule assembly inner vestibule groove upon superimposition of the second vestibule assembly outer vestibule with the second vestibule assembly inner vestibule.

41. A forced-air cooling process chamber for heat treating a product as recited in claim 40, wherein the additional cooling port fluidly communicates with the flow passage thereby allowing passage of the temperature adjusting medium from the flow passage.

42. A forced-air cooling process chamber for heat treating a product as recited in claim 40, wherein the vestibule assembly is offset from the second vestibule assembly thereby allowing uniform temperature adjustment of the forced-air cooling process chamber.

43. A forced-air cooling process chamber for heat treating a product as recited in claim 42, wherein the offset is half an angular distance between the cooling port and the additional cooling port.

44. A forced-air cooling process chamber for heat treating a product as recited in claim 38, wherein the vestibule assembly forms an end cap for the forced-air cooling process chamber.

45. A forced-air cooling process chamber for heat treating a product as recited in claim 44, the vestibule assembly further comprising:
   a heating element disposed within the end cap where the heating element controls a temperature within a portion of the forced-air cooling process chamber.

46. A forced-air cooling process chamber for heat treating a product as recited in claim 38, wherein the temperature adjusting medium is air.

47. A forced-air cooling process chamber for heat treating a product as recited in claim 38, the forced-air cooling process chamber further comprising:
   a buffer zone, where the buffer zone is disposed intermediate the housing first end and the outer vestibule assembly, wherein a section of the cooling port extends through the buffer zone and fluidly communicates with the flow passage.

48. A forced-air cooling process chamber for heat treating a product as recited in claim 47, the forced-air cooling process chamber further comprising:
   a process zone disposed adjacent the buffer zone, wherein the temperature adjusting medium is injected into the forced-air cooling process chamber intermediate the process zone and the buffer zone.

49. A forced-air cooling process chamber for heat treating a product as recited in claim 48, wherein the section of the cooling port which extends through the buffer zone extends to a point intermediate the process zone and the buffer zone.

50. A forced-air cooling process chamber for heat treating a product, the forced-air cooling process chamber comprising:
   a housing;
   a flow passage disposed about a periphery of the housing, the flow passage allowing for a flow of a temperature adjusting medium about the periphery of the housing; and
   a vestibule assembly disposed at a first end of the housing, the vestibule assembly being in fluid communication with the flow passage, the vestibule assembly comprising:
      an outer vestibule, the outer vestibule having a first groove, the first groove being formed in an radial surface of the outer vestibule; and
      an inner vestibule, the inner vestibule having a second groove, the second groove being formed in a radial surface of the inner vestibule where a cooling port is placed within the first groove and the second groove when the first groove and the second groove are placed in an axially superimposed relationship, the first groove and the second groove rigidly holding the cooling port between the inner vestibule and the outer vestibule, the cooling port being in fluid communication with the flow passage thereby allowing passage of the temperature adjusting medium wherein the cooling port is a unitary piece such that the flow passage and the vestibule assembly provide low particulate contamination within the forced-air cooling process chamber.

51. A forced-air cooling process chamber for heat treating a product as recited in claim 50, the forced-air cooling process chamber further comprising:
   a buffer zone, where the buffer zone is disposed intermediate the housing first end and the outer vestibule wherein the cooling port extends through the buffer zone and fluidly communicates with the flow passage.

52. A forced-air cooling process chamber for heat treating a product as recited in claim 51, the forced-air cooling process chamber further comprising:
   a process zone disposed adjacent the buffer zone, wherein the temperature adjusting medium is injected into the forced-air cooling process chamber intermediate the process zone and the buffer zone.

* * * * *